(12) United States Patent
Kim et al.

(10) Patent No.: US 12,507,568 B2
(45) Date of Patent: Dec. 23, 2025

(54) DISPLAY DEVICE

(71) Applicant: Samsung Display Co., Ltd., Yongin-Si (KR)

(72) Inventors: Si Kwang Kim, Yongin-si (KR); Jin-Su Byun, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/399,695

(22) Filed: Dec. 29, 2023

(65) Prior Publication Data
US 2024/0381734 A1    Nov. 14, 2024

(30) Foreign Application Priority Data
May 10, 2023  (KR) .................. 10-2023-0060462

(51) Int. Cl.
| | | |
|---|---|---|
| *H10K 59/40* | (2023.01) | |
| *G06F 3/044* | (2006.01) | |
| *H10K 59/122* | (2023.01) | |
| *H10K 59/123* | (2023.01) | |
| *H10K 59/80* | (2023.01) | |

(52) U.S. Cl.
CPC .......... *H10K 59/40* (2023.02); *G06F 3/0446* (2019.05); *H10K 59/122* (2023.02); *H10K 59/123* (2023.02); *H10K 59/873* (2023.02)

(58) Field of Classification Search
CPC .... H10K 59/40; H10K 59/879; H10K 59/873; H10K 50/844; H10K 59/126; H10K 59/878; H10K 50/858; G06F 3/0446
See application file for complete search history.

(56) References Cited

U.S. PATENT DOCUMENTS

| | | | |
|---|---|---|---|
| 10,811,478 B2 | 10/2020 | Choi et al. | |
| 2021/0143235 A1* | 5/2021 | Byun | H10K 59/873 |
| 2022/0013607 A1* | 1/2022 | Lee | H10K 59/875 |
| 2022/0121301 A1* | 4/2022 | Son | H10K 50/10 |
| 2022/0140010 A1* | 5/2022 | Lee | H10K 59/121 |
| | | | 345/173 |
| 2022/0149319 A1 | 5/2022 | Kim et al. | |
| 2022/0158126 A1* | 5/2022 | Kim | H10K 59/873 |

(Continued)

FOREIGN PATENT DOCUMENTS

| | | |
|---|---|---|
| KR | 10-2010-0073228 A | 7/2010 |
| KR | 10-1042707 B1 | 6/2011 |

(Continued)

*Primary Examiner* — Matthew A Eason
*Assistant Examiner* — Scott D Au
(74) *Attorney, Agent, or Firm* — Innovation Counsel LLP

(57) ABSTRACT

A display device includes a pixel defining layer on a first electrode and including a pixel opening overlapping the first electrode, an encapsulation layer on the pixel defining layer and the first electrode, a sensing electrode on the encapsulation layer, a second sensing insulating layer on the sensing electrode and overlapping the pixel opening, and a third sensing insulating layer on the second sensing insulating layer and the sensing electrode. The second sensing insulating layer includes a first sub-sensing insulating layer including an inorganic material and having a first refractive index, and a second sub-sensing insulating layer including an organic material and having a second refractive index, the first refractive index being greater than the second refractive index.

20 Claims, 20 Drawing Sheets

(56) References Cited

U.S. PATENT DOCUMENTS

2022/0416212 A1 12/2022 Byun et al.
2023/0042183 A1 2/2023 Kim et al.

FOREIGN PATENT DOCUMENTS

| KR | 10-2020-0014463 A | 2/2020 |
| KR | 10-2022-0064014 A | 5/2022 |
| KR | 10-2023-0003683 A | 1/2023 |
| KR | 10-2023-0022347 A | 2/2023 |

* cited by examiner

DISPLAY DEVICE

CROSS-REFERENCE TO RELATED APPLICATION

This application claims priority to and the benefit of Korean Patent Application No. 10-2023-0060462 filed at the Korean Intellectual Property Office on May 10, 2023, the entire contents of which are incorporated herein by reference.

BACKGROUND

(a) Field of the Invention

The present disclosure relates to a display device, and more particularly, to a display device having improved light emission efficiency.

(b) Description of the Related Art

A display device such as a liquid crystal display (LCD), an organic light emitting diode (OLED), and the like generally displays images on a screen. Such display devices may be used in various electronic devices such as mobile phones, navigation devices, digital cameras, electronic books, portable game consoles, and terminals.

A display device such as an organic light emitting display device can have a structure using a flexible substrate that allows the display device to be bent or folded.

In small electronic devices such as mobile phones, optical elements such as cameras and optical sensors are commonly formed in the bezel region around the display area, but as the sizes of display screens have increased, the size of the area around display areas have gradually decreased. However, technology that can position an optical sensor on the back of the display area is being developed.

SUMMARY

Embodiments disclosed herein may provide a display device capable of improving light emission efficiency and display quality.

A display device according to an embodiment includes a substrate, a transistor disposed on the substrate, a first electrode electrically connected to the transistor, and a pixel defining layer disposed on the first electrode and having a pixel opening overlapping the first electrode, an encapsulation layer positioned on the pixel-defining layer and the first electrode, a sensing electrode positioned on the encapsulation layer, a second sensing insulating layer positioned on the sensing electrode and overlapping the pixel opening, and a third sensing insulating layer disposed on the sensing electrode and the second sensing insulating layer, wherein the second sensing insulating layer has a first refractive index and includes a first sub-sensing insulating layer including an inorganic material and a second sub-sensing insulating layer having a second refractive index and including an organic material, wherein the first refractive index is greater than the second refractive index.

The first refractive index may be about 1.8 to about 1.9.

The second refractive index may be about 1.6 to about 1.7.

The thickness of the first sub-sensing insulating layer may be greater than or equal to about 1 micrometer and less than about 4 micrometers.

The second sensing insulating layer may have a thickness of about 2 micrometers or more and less than about 8 micrometers.

A taper angle of the second sensing insulating layer may be about 60 degrees to about 90 degrees.

A distance between an end of the pixel opening and an end of the second sensing insulating layer may be in the range of about 1.45 micrometers to about 9 micrometers.

The refractive index of the third sensing insulating layer may be about 1.6 or less.

The display device may further include a first sensing insulating layer positioned between the encapsulation layer and the sensing electrode.

The first sensing insulating layer may include a first portion having a first thickness and a second portion having a second thickness, and the first thickness may be greater than the second thickness.

The first portion may overlap the sensing electrode.

A thickness of the first portion may be equal to a sum of a thickness of the second portion and a thickness of the first sub-sensing insulating layer.

The first sub-sensing insulating layer and the first sensing insulating layer may include the same material.

The display device according to an embodiment includes a substrate, a transistor disposed on the substrate, a first electrode electrically connected to the transistor, a pixel defining layer disposed on the first electrode and including a pixel opening overlapping the first electrode, an encapsulation layer disposed on the pixel defining layer and the first electrode, a sensing electrode located on the encapsulation layer, a first sub-sensing insulating layer located on the sensing electrode and overlapping the pixel opening, a second sub-sensing insulating layer located on the first sub-sensing insulating layer, and a third sensing insulating layer covering a side of the first sub-sensing insulating layer, and a side and upper surfaces of the second sub-sensing insulating layer, and a refractive index decreases in order of the first sub-sensing insulating layer, the second sub-sensing insulating layer, and the third sensing insulating layer.

The first sub-sensing insulating layer and the second sub-sensing insulating layer may overlap the pixel opening and a portion of the pixel defining layer.

The first sub-sensing insulating layer may include an inorganic material, and the second sub-sensing insulating layer and the third sensing insulating layer may include an organic material.

The refractive index of the first sub-sensing insulating layer may be about 1.8 to about 1.9, the refractive index of the second sub-sensing insulating layer may be about 1.6 to about 1.7, and the refractive index of the second sensing insulating layer may be less than about 1.6.

A thickness of each of the first sub-sensing insulating layer and the second sub-sensing insulating layer may be greater than or equal to about 1 micrometer and less than or equal to about 4 micrometers.

The display device may further include a first sensing insulating layer positioned under the sensing electrode.

The first sensing insulating layer and the first sub-sensing insulating layer may include the same material.

According to embodiments, an insulating layer having a difference in refractive index may be formed on the emission layer to transmit light to the front or side surfaces, thereby improving light emission efficiency of the display device.

DETAILED DESCRIPTION

Figure 1A:
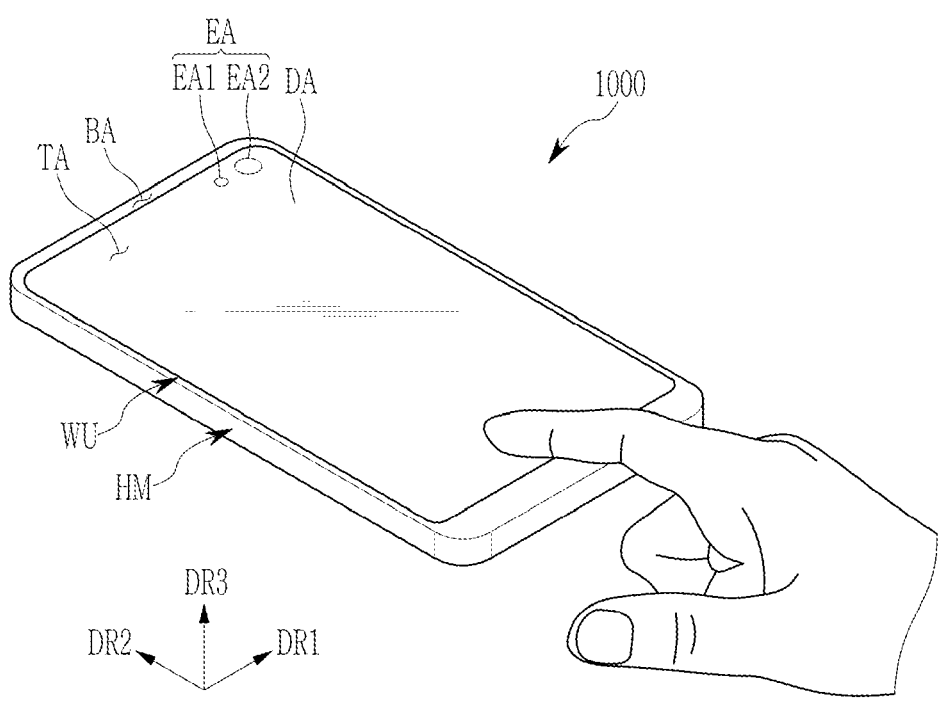
FIG. 1A and FIG. 1B are schematic perspective views illustrating display devices according to alternative embodiments of the present disclosure.

Hereinafter, with reference to the accompanying drawings, various embodiments will be described in detail so that those skilled in the art can easily carry out the principles of the present disclosure. The present invention may be embodied in many different forms and is not limited to the embodiments set forth herein.

In order to concisely describe the embodiments, parts irrelevant to the description may be omitted, and the same reference numerals may be assigned to the same or similar constituent elements throughout the specification and drawings.

In the drawings, thicknesses of layers or regions may be shown enlarged or exaggerated to clearly illustrate the various layers and regions and for convenience of explanation. Since the size and thickness of each component shown in the drawings may be arbitrary, the embodiments are not necessarily limited to the sizes and shapes shown.

The following may describe a part such as a layer, film, region, or plate as being "above" or "on" another part. This includes not only the case where the part is "directly on" the other part, but also the case where yet another part is between the parts. In contrast, when a part is said to be "directly on" another part, it means that there is no other part in between.

In addition, being "above" or "on" a reference part means being positioned above or below relative to the reference part but does not necessarily mean being positioned "above" or "on" based the direction of gravity.

In addition, throughout the specification, when a certain component is said to "include," it means that it may further include other components without excluding other components, unless otherwise stated.

Also, throughout the specification, a "planar" image or view means an image or view of the target part from above a major surface, and a "cross-sectional" view or image means a view or image when the target part is cut and viewed.

Also, throughout the specification, when "connected" is used, this does not mean only the case where two or more constituent elements are directly connected, but when two or more components are indirectly connected through another component, physically connected, in the case of being connected or electrically connected, as well as being referred to by different names depending on location or function, and each part that is substantially integral may be connected to each other.

In addition, throughout the specification, a structure such as a wiring, layer, film, region, plate, or component "extends in a first direction or a second direction," means not only extending along a straight line directed in the corresponding direction. Instead, the structure may generally extend along the first direction or the second direction, and the structure may be bent at one part, have a zigzag shape, or extends with a curved shape.

Also, electronic devices (for example, mobile phones, TVs, monitors, or laptop computers) that include display devices, display panels, etc. described in the specification, or electronic devices that include display devices, display panels, etc. manufactured by the manufacturing method described in the specification are not excluded from the scope of rights of this specification.

Figure 1B:
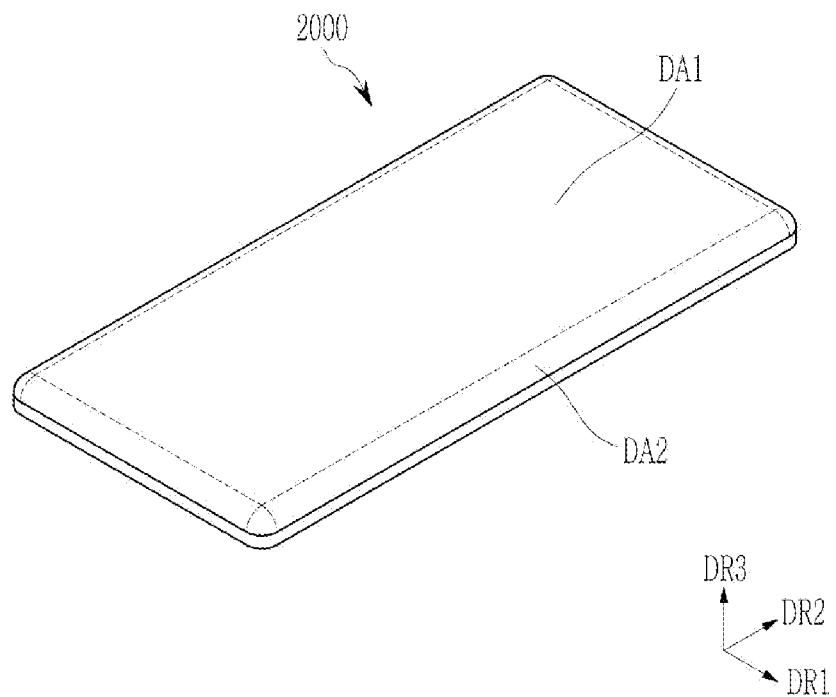
Figure 2:
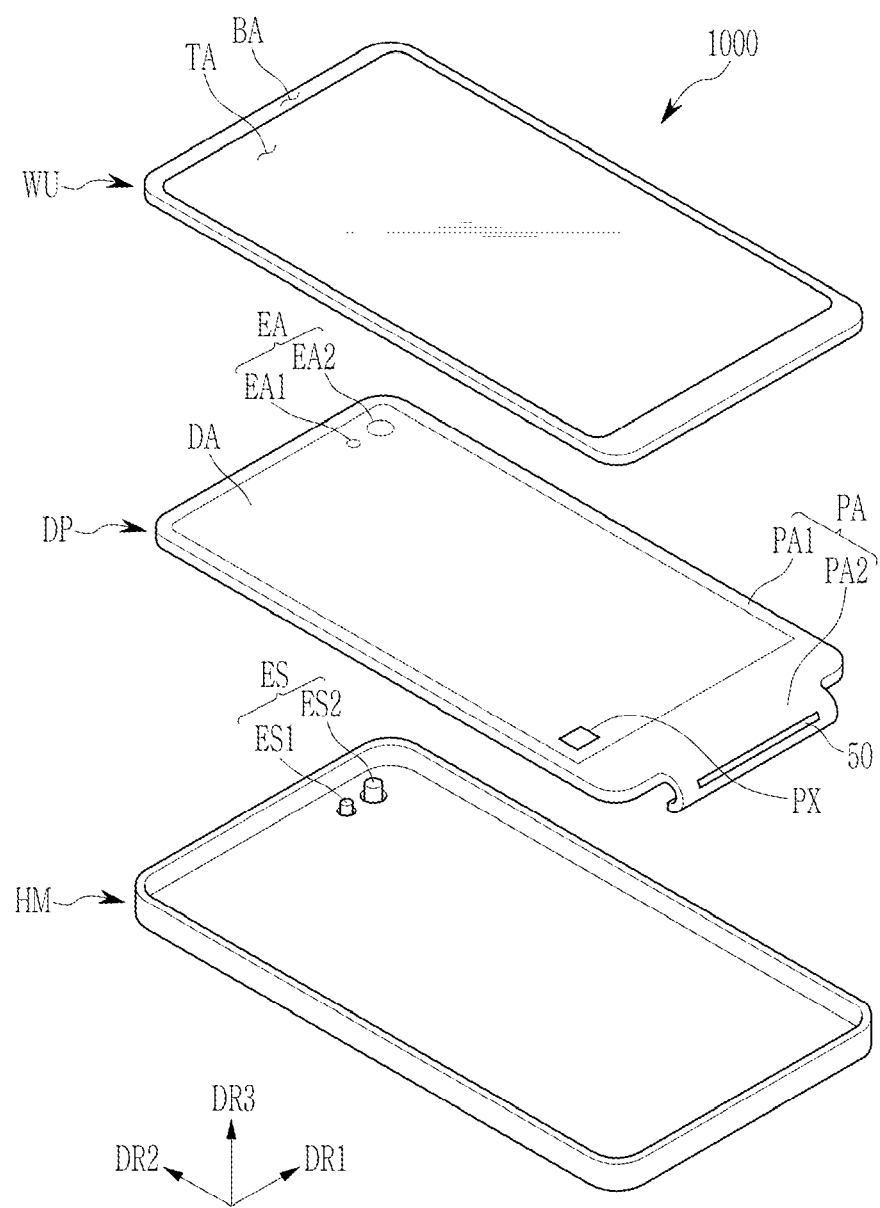
FIG. 2 is an exploded perspective view of a display device according to an embodiment.
Figure 3:
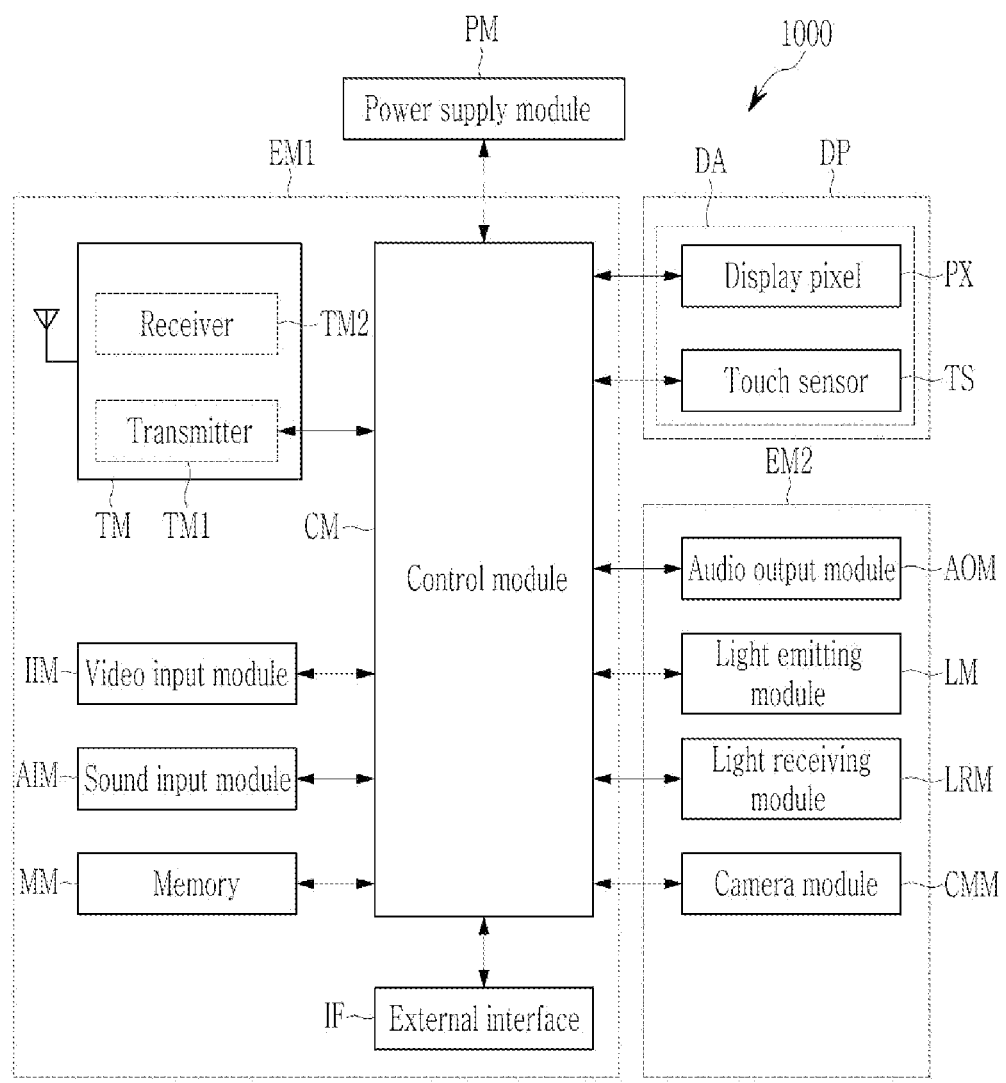
FIG. 3 is a block diagram of a display device according to an embodiment.

Hereinafter, various embodiments and modifications will be described in detail with reference to the drawings. In particular, embodiments of display devices will be described with reference to FIGS. 1A, 1B, 2, and 3. FIG. 1A is a schematic perspective view illustrating use of the display device according to an embodiment having a flat display screen, and FIG. 1B is a perspective view of a display device according to another embodiment having a curved display screen. FIG. 2 is an exploded perspective view of a display device according to an embodiment, and FIG. 3 is a block diagram of the display device according to an embodiment.

Referring to FIG. 1A, a display device 1000 according to an embodiment is a device for displaying a moving image or a still image. In general, such a device may be a mobile phone, a smart phone, a tablet personal computer (PC), a communication terminal, an electronic notebook, an e-book, a portable multimedia player (PMP), a navigation system, or an ultra-mobile PC (UMPC). The display device 1000 can be used to provide a display screen for various products such as televisions, laptops, monitors, billboards, Internet of things (IoT), etc. In addition, the display device 1000 may be suitable for wearable devices such as smart watches, watch phones, glasses-type displays, and head mounted displays (HMD). In addition, the display device 1000 may be included in a dashboard of a vehicle, a center information display (CID) disposed on a center fascia or dashboard of a vehicle, a room mirror display replacing a side mirror of a vehicle, an entertainment system for the back seat of a vehicle, or a display placed on the back of the front seat of a vehicle. For convenience of description, FIG. 1A shows the specific example in which the display device 1000 is a smart phone.

The display device 1000 may display an image, which may be a still image or a dynamic or moving image, on a display surface that is flat and parallel to each of first and second directions DR1 and DR2, and the displayed image may be viewed from a third direction DR3. The display surface on which the image is displayed may correspond to the front surface of the display device 1000 and may correspond to the front surface of the cover window WU. In this embodiment, the front (or upper surface) and rear surface (or lower surface) of each member are defined based on the direction in which the image is displayed.

The front surface and the rear surface oppose each other in the third direction DR3, and a normal direction of each of the front surface and the rear surface may be parallel to the third direction DR3. The distance between the front and rear surfaces in the third direction DR3 may correspond to the thickness of the display panel in the third direction DR3.

The display device 1000 according to an embodiment may detect a user's input (refer to a hand in FIG. 1A) applied from the outside the display device 1000. The user's input may include various types of external inputs, such as a part of the user's body, light, heat, or pressure applied to the front surface of the display device 1000. In the embodiment illustrated in FIG. 1A, the user's input is shown as the user's hand being applied in the foreground. However, the present invention is not limited thereto. User input may be provided in various forms. Also, the display device 1000 may detect a user's input applied to the side or rear surface of the display device 1000 according to the structure of the display device 1000.

Referring to FIG. 1B, a display device 2000 according to another embodiment may include a first display area DA1 facing the front, and a second display area DA2 that is curved or inclined at a predetermined angle with respect to the first display area DA1. The display device 2000 may otherwise be used in the same applications and may have the same or similar structure to the display device 1000. As shown in FIG. 1B, the second display area DA2 may be positioned at the edges (including each of the four corners) of the first display area DA1, but the second display area DA2 is not limited thereto and may be positioned at any one or more edges or corners of the display device 2000. According to the embodiment in FIG. 1B, a user can recognize light emitted from the front of the display panel as being an image in the first display area DA1, and the user can recognize light emitted from the side of the display panel as being an image in the second display area DA2. Since a user may view both the first display area DA1 and the second display device DA2 at the same time, e.g., from the third direction DR3, front light emission efficiency and side light emission efficiency are both important for the display device 2000.

Referring back to FIG. 1A and FIG. 2, the display device 1000 may include a cover window WU, a housing HM, a display panel DP, and an element system ES. In an embodiment, the cover window WU and the housing HM may be combined to form the exterior of the display device 1000.

The cover window WU may include an insulating panel. For example, the cover window WU may be made of glass, plastic, or a combination thereof. The front surface of the cover window WU may define the front surface of the display device 1000. A transmission region TA of the cover window WU may be an optically transparent region. For example, the transmission region TA may have a visible light transmittance of about 90% or more. A blocking region BA may define the shape of the transmission region TA.

The blocking region BA may be adjacent to the transmission region TA and may surround the transmission region TA. The blocking region BA may have relatively low light transmittance compared to the transmission region TA. The blocking region BA may include an opaque material that blocks light. The blocking region BA may have a predetermined color. The blocking region BA may be defined by a bezel layer provided separately from the transparent substrate defining the transmission region TA or may be defined by an ink layer inserted into or colored in the transparent substrate.

A display panel DP may include a front surface including the display area DA and a non-display area PA. The display area DA of the display panel DP may be a region where pixels operate according to electrical signals to emit light. The non-display area PA of the display panel DP may include a driving unit 50.

In an embodiment, the display area DA may be a region including pixels and displaying an image, and a touch sensor may be positioned above in the third direction DR3 of the pixels. The touch sensor may be a device that detects external input.

The transmission region TA of the cover window WU may at least partially overlap the display area DA of the display panel DP. For example, the transmission region TA may overlap the entire surface of the display area DA or may overlap at least a portion of the display area DA. Accordingly, the user may view the display area DA and the image that the display area DA shows, through the transmission region TA, and the user may provide an external input based on the image. However, embodiments are not limited thereto. For example, within the display area DA, an area where an image is displayed and a region where an external input is sensed may be separated from each other.

The non-display area PA of the display panel DP may at least partially overlap the blocking region BA of the cover window WU. In particular, the non-display area PA may be a region covered by the blocking region BA. The non-display area PA is adjacent to the display area DA and may surround the display area DA. An image is not displayed in the non-display area PA, and a driving circuit or a driving wire for driving the display area DA may be disposed in the non-display area DA.

The non-display area PA may include a first peripheral area PA1 positioned outside the display area DA and a second peripheral area PA2 including the driving unit 50, connection wires, and a bending region. In the embodiment of FIG. 2, the first peripheral area PA1 is positioned on three sides of the display area DA, and the second peripheral area PA2 is positioned on the remaining side of the display area DA.

In an embodiment, the display panel DP may be assembled in a flat state with the display area DA and the non-display area PA facing the cover window WU. However, embodiments are not limited thereto.

A part of the non-display area PA of the display panel DP may be bent. When bent, a part of the non-display area PA faces the rear surface of the display device 1000. This permits the size of the blocking region BA visible on the front surface of the display device 1000 to be reduced. In FIG. 2, the second peripheral area PA2 may be bent so that at least a portion of the second peripheral area PA2 is positioned on the rear surface of the display area DA when the display device 1000 is assembled.

The display panel DP may further include a component region EA, and specifically, a first component region EA1 and a second component region EA2. The first component region EA1 and the second component region EA2 may be at least partially surrounded by the display area DA. The first component region EA1 and the second component region EA2 are illustrated as being spaced apart from each other but are not limited thereto, and the first component region EA1 and the second component region EA2 may be connected at least in part. Components that use infrared light, visible light, or sound may be disposed below the first component region EA1 and the second component region EA2.

A plurality of light emitting diodes and a plurality of pixel circuit units generating and transmitting a light emitting current to each of the plurality of light emitting diodes may be formed or disposed in the display area DA. In an embodiment of the display area DA, one pixel circuit unit corresponds to one light emitting diode. Here, one light emitting diode and a corresponding pixel circuit unit are referred to as a pixel PX.

The first component region EA1 may include a transmission portion through which light or/and sound may pass and a display portion including a plurality of pixels. In an embodiment, the transmission portion may be positioned between adjacent pixels and may be composed of a layer through which light or/and sound can pass. In an embodiment, the transmission portion may be positioned between adjacent pixels, and a layer that does not transmit light, such as a light blocking member, may overlap the first component region EA1.

The number of pixels per unit area (hereinafter referred to as resolution) of the pixels included in the display area DA (hereinafter referred to as normal pixels) and the pixels included in the first component region EA1 (hereinafter referred to as first component pixels) may be the same.

The second component region EA2 may include an area made of a transparent layer to allow light to pass therethrough (hereinafter referred to as a light transmitting area, and a layer—for example, a pixel defining layer and/or a light blocking member—may include an opening overlapping a position corresponding to the second component region EA2 so as not to block light.

The number of pixels per unit area of the pixels (hereinafter referred to as second component pixels) included in the second component region EA2 may be smaller than the number of pixels per unit area of normal pixels included in the display area DA. As a result, the resolution of the second component pixels may be lower than that of the normal pixels.

Referring to FIG. 1A, FIG. 2, and FIG. 3, the display panel DP may include a display area DA containing display pixels PX and a touch sensor TS. A user may see the display panel DP from the outside through the transmission region TA and particularly recognize an image that pixels PX generate. Also, the touch sensor TS may be positioned above the pixels PX and may detect an external input that the user may apply. The touch sensor TS may detect the external input applied or provided to the cover window WU.

Again, referring to FIG. 2, the second peripheral area PA2 may include a bending portion. The display area DA and the first peripheral area PA1 may have a flat state substantially parallel to a plane defined by the first and second directions DR1 and DR2, the second peripheral area PA1 may be flat, and the second peripheral area PA2 may include a first flat portion, a second flat portion, and a bending portion extending from the first flat portion to the second flat portion. At least the bending portion of the second peripheral area PA2 may be bent, and the display panel DP may be assembled to position the second flat area behind the rear side of the display area DA. When assembled, at least the second flat portion of the second peripheral area PA2 overlaps the display area DA, so the blocking region BA of the display device 1000 may be reduced in size. However, embodiments are not limited thereto. For example, the second peripheral area PA2 may not be bent.

The driving unit 50 may be mounted on the second peripheral area PA2 and may be mounted on the bending portion or positioned on one or both sides of the bending portion. The driving unit 50 may be provided in the form of a chip. The driving unit 50 may be electrically connected to the display area DA to transmit an electrical signal to the display area DA. For example, the driving unit 50 may provide data signals to the pixels PX disposed in the display area DA. Alternatively or additionally, the driving unit 50 may include a touch driving circuit and may be electrically connected to the touch sensor TS disposed in the display area DA. More generally, the driving unit 50 may include various circuits in addition to the above-described circuits or may be designed to provide various electrical signals to the display area DA.

A pad unit may be positioned at an end of the second peripheral area PA2 and electrically connected to a flexible printed circuit board (FPCB) including a driving chip. Here, the driving chip positioned on the flexible printed circuit board may include various driving circuits for driving the display device 1000 or connectors for supplying power. In some embodiments, a rigid printed circuit board (PCB) may be used instead of a flexible printed circuit board.

The element system ES may be disposed below the display panel DP. The element system ES may include a first element ES1 overlapping the first component region EA1 of the display panel DP and a second element ES2 overlapping the second component region EA2 of the display panel DP.

The first element ES1 may be an electronic element using light or sound. For example, the first element ES1 may be an optical sensor such as an infrared sensor that receives and uses light, a sensor that outputs and senses light or sound to measure a distance or to recognize a fingerprint, or a small lamp that outputs light. The first element ES1 also may be a speaker or the like that outputs sound. In the case of an electronic element using light, light of various wavelength bands such as visible light, infrared light, and ultraviolet light can be used.

The second element ES2 may be an optical device including at least one of a camera, an infrared camera (IR camera), a dot projector, an infrared illuminator (IR illuminator), and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other.

FIG. 3 illustrates a display pixel PX and a touch sensor TS positioned in the display area DA among the components of the display panel DP.

The power supply module PM may supply power required for overall operation of the display device 1000. The power supply module PM may include a conventional battery module.

The first electronic module EM1 and the second electronic module EM2 may include various functional modules for operating the display device 1000.

The first electronic module EM1 may be directly mounted on a motherboard electrically connected to the display panel DP or may be mounted on a separate board and electrically connected to the motherboard through a connector (not shown). The first electronic module EM1 may include a control module CM, a wireless communication module TM, an image input module IIM, an audio input module AIM, memory MM, and an external interface IF. Some of these modules may not be mounted on the motherboard and may be electrically connected to the motherboard through a flexible printed circuit board.

The control module CM may control overall operations of the display device 1000. The control module CM may be a microprocessor that may be programmable to perform functions that the display device 1000 requires. For example, the control module CM activates or deactivates the display panel DP. The control module CM may control other modules such as the image input module IIM or the audio input module AIM based on the touch signal received from the display panel DP.

The wireless communication module TM can transmit/receive radio signals with other terminals using a Bluetooth or Wi-Fi link or protocol. The wireless communication module TM can transmit/receive voice signals using a general communication link. In the illustrated embodiment, the wireless communication module TM includes a transmitter TM1 for modulating and transmitting a transmitted signal and a receiver TM2 for receiving and demodulating a received signal.

The image input module IIM may process an image signal and convert the image signal into image data that can be displayed on the display panel DP.

The audio input module AIM may receive an external sound signal through a microphone in a recording mode, a voice recognition mode, or the like, and convert the external sound signal into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, a light emitting module LM, a light receiving module LRM, and a camera module CMM. At least some of the modules in the second electronic module EM2 may be optical elements of the element system ES, which may be positioned on the rear surface of the display panel DP. For example, the element system ES may include the light emitting module LM, the light receiving module LRM, and the camera module CMM. The second electronic module EM2 is directly mounted on the motherboard, mounted on another board and electrically connected to the display panel DP through a connector (not shown), or connected to the first electronic module EM1.

The audio output module AOM may convert audio data received from the wireless communication module TM or audio data stored in the memory MM and may output the converted audio data.

The light emitting module LM may generate an output light. For example, the light emitting module LM may include an LED element, and the light emitting module LM may output infrared rays.

The light receiving module LRM may include a CMOS sensor that detects light. For example, the light receiving module LRM may detect infrared rays. In an embodiment, the light receiving module LRM may be activated when infrared rays of a predetermined level or higher are detected. In an embodiment, after infrared light generated by the light emitting module LM is output, the infrared light may be reflected by an external subject (e.g., a user's finger or face), and the reflected infrared light may be incident on and detected by the light receiving module LRM.

The camera module CMM may capture an external image.

In an embodiment, the element system ES may additionally include a light detection sensor or a heat detection sensor.

The element system ES may detect an external subject received through the front surface or provide a sound signal such as a voice to the outside through the front surface.

Also, the element system ES may include a plurality of elements and is not limited to an embodiment.

Again, referring to FIG. 2, the housing HM may be coupled to the cover window WU, which may be disposed on the front surface of the housing HM. The housing HM coupled to the cover window WU provides a predetermined accommodation space, and the display panel DP and the element system ES may reside in the predetermined accommodation space provided between the housing HM and the cover window WU.

The housing HM may include a material with relatively high rigidity. For example, the housing HM may include a plurality of frames and/or plates made of glass, plastic, or metal, or a combination thereof. The housing HM can stably protect components of the display device 1000 accommodated in the inner space from external impact.

Figure 4:
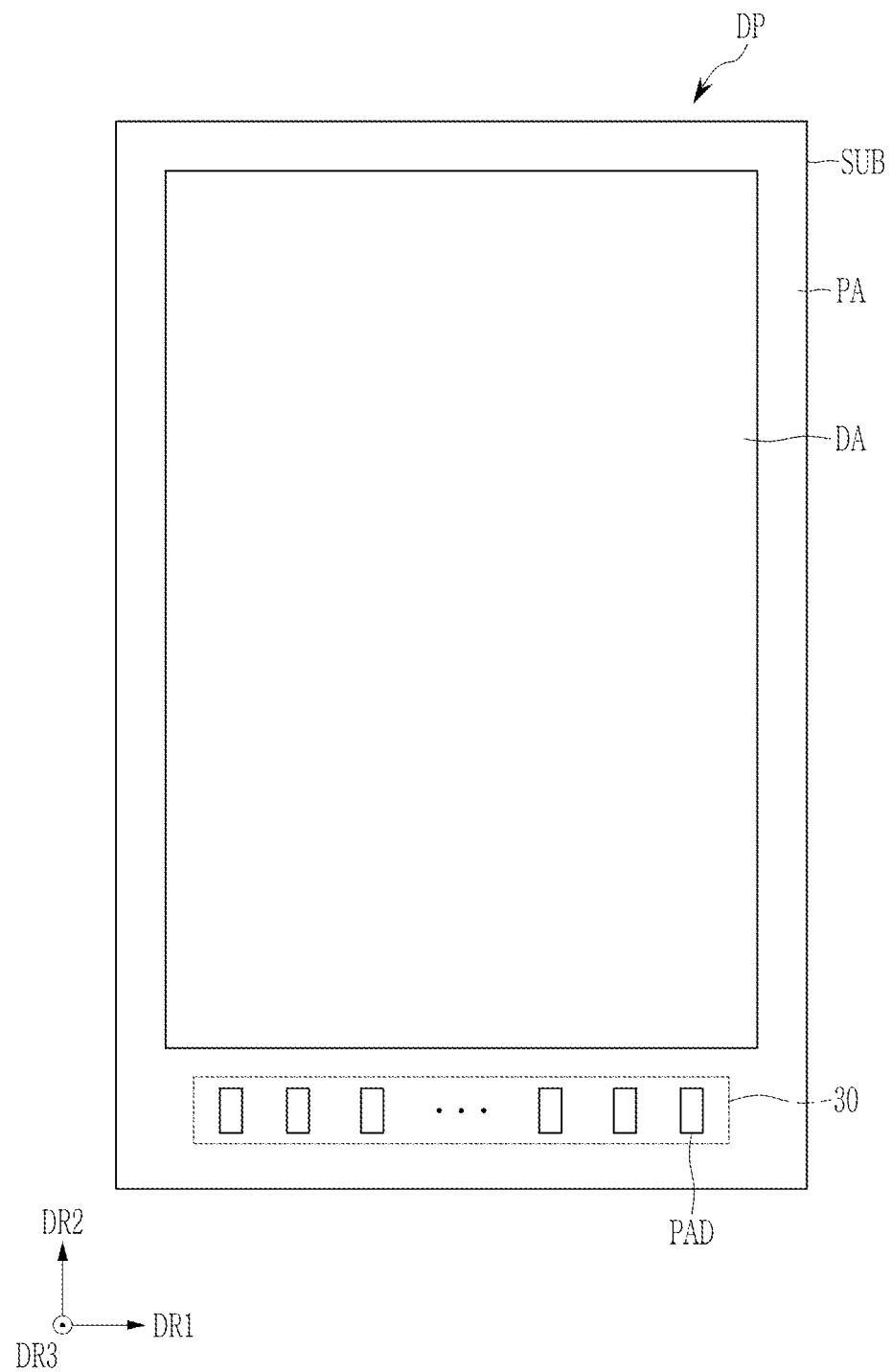
FIG. 4 is a schematic top plan view of a portion of a display panel according to an embodiment.
Figure 5:
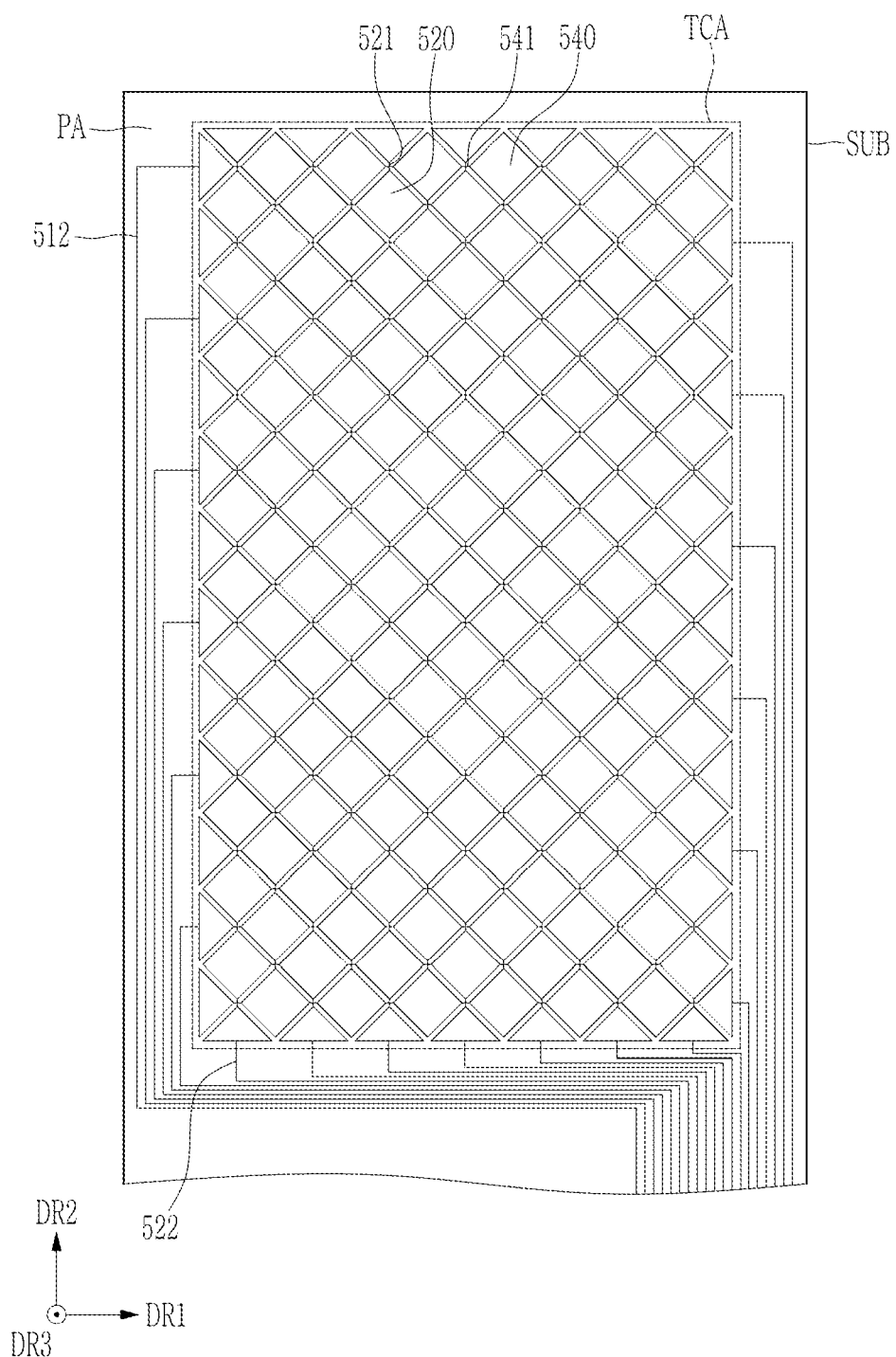
FIG. 5 is a schematic top plan view of a sensing electrode in a display panel according to an embodiment.

Hereinafter, the display panel of the display device according to an embodiment will be described with reference to FIG. 4 and FIG. 5. FIG. 4 is a schematic top plan view of a portion of a display panel according to an embodiment, and FIG. 5 is a schematic top plan view of a sensing electrode in the display panel according to an embodiment.

First, referring to FIG. 4, the display panel DP of the display device 1000 according to an embodiment includes a substrate SUB and a pad unit 30.

The substrate SUB may be divided into a display area DA and a non-display area PA. The display area DA is a region where multiple light emitting diodes and multiple pixel circuits generating and transmitting light emitting current to each light emitting diode are formed to display an image, and the non-display area PA is a region where an image is not displayed.

The non-display area PA may surround the display area DA. The non-display area PA may include the pad unit 30 where a pad PAD for applying a driving signal to a pixel is formed. The pad unit 30 may be positioned in a portion of the non-display area PA and generally includes a plurality of pads PAD.

The pixel circuit included in the pixel (not shown) positioned in the display area DA corresponds to a light-emitting diode included in the pixel (not shown) positioned in the display area DA. A plurality of pixel circuits can be arranged in a matrix or array form, and the light emitting diodes positioned above the pixel circuits can be arranged in various forms.

Referring to FIG. 5, a sensing region TCA including a plurality of sensing electrodes 520 and 540 may be positioned above the display area DA and above the light emitting diodes to recognize a touch. The sensing region TCA may be a region where the touch sensor TS is positioned.

A signal line or voltage line (e.g., a driving voltage line or a driving low voltage line) for transmitting a signal or voltage to a pixel formed in the display area DA may be positioned in or extend into the non-display area PA. The pad unit 30 connected to the signal line or voltage line may be positioned on the non-display area PA. In addition, a plurality of sensing wires 512 and 522 may also be positioned in the non-display area PA. The plurality of sensing wires 512 and 522 may be connected to the plurality of sensing electrodes 520 and 540 and may be connected to some pads PAD of the pad unit 30.

Voltages, signals, and the like may be applied to a plurality of voltage lines (not shown) connected to the display area DA and a plurality of sensing wires 512 and 522 through the plurality of pads PAD of the pad unit 30.

A flexible printed circuit board (FPCB) may be attached to the pad unit 30 of the non-display area PA so that the flexible printed circuit board (FPCB) and the pad unit 30 may be electrically connected. In this case, the flexible printed circuit board (FPCB) and the pad unit 30 may be electrically connected by an anisotropic conductive film.

As shown in FIG. 5, the sensing region TCA may include a plurality of sensing electrodes 520 and 540. The plurality of sensing electrodes 520 and 540 may include a plurality of first sensing electrodes 520 and a plurality of second sensing electrodes 540 electrically separated from each other. In some embodiments, the plurality of first sensing electrodes 520 may be sensing input electrodes, and the plurality of second sensing electrodes 540 may be sensing output electrodes. However, embodiments are not limited thereto, and the plurality of first sensing electrodes 520 may be sensing output electrodes, and the plurality of second sensing electrodes 540 may be sensing input electrodes.

The plurality of first sensing electrodes 520 and the plurality of second sensing electrodes 540 may be distributed and arranged in a mesh shape so as not to overlap each other in the sensing region TCA. The plurality of first sensing electrodes 520 are arranged along one of the column and row directions (refer to FIG. 5, the second direction DR2). The plurality of first sensing electrodes 520 are electrically connected to each other by a first sensing electrode connecting part 521; also referred to as a bridge. Meanwhile, the plurality of second sensing electrodes 540 are also arranged along the other one of the row and column directions (refer to FIG. 5, the first direction DR1). The plurality of second sensing electrodes 540 are electrically connected to each other through the second sensing electrode connection part 541.

The plurality of first sensing electrodes 520 and the plurality of second sensing electrodes 540 may be positioned on the same conductive layer. In other embodiments, the plurality of first sensing electrodes 520 and the plurality of second sensing electrodes 540 may be positioned on different conductive layers.

Referring to FIG. 5, the first sensing electrode 520 and the second sensing electrode 540 may have a rhombic shape, but are not limited thereto, and may have a polygonal shape such as a quadrangle or a hexagon, a circular shape, or an elliptical shape, depending on embodiments.

Referring to FIG. 5, although the plurality of first sensing electrodes 520 and the plurality of second sensing electrodes 540 are shown as an integral structure of a rhombus, in reality, each of the rhombic structures may have an opening and a linear structure that forms a mesh-like arrangement. In this case, the opening may correspond to an area through which an underlying one of the light emitting diodes emits light upward.

In addition, in some embodiments, each sensing electrode 520 or 540 may have a shape further including an extension part to improve the sensitivity of the touch sensor.

The first sensing electrode 520 and the second sensing electrode 540 may be formed of a transparent conductor or an opaque conductor. For example, the first sensing electrode 520 and the second sensing electrode 540 may include transparent conductive oxide (TCO), and the transparent conductive oxide (TCO) may include at least one of indium-tin oxide (ITO), indium-zinc oxide (IZO), zinc oxide (ZnO), carbon nanotube (CNT), and graphene. Also, the first sensing electrode 520 and the second sensing electrode 540 may include a plurality of openings. The openings formed in the sensing electrodes 520 and 540 serve to allow light emitted from the light emitting diodes to be emitted without interference.

When the first sensing electrode 520 and the second sensing electrode 540 are positioned on the same layer, one of the first sensing electrode connection part 521 and the second sensing electrode connection part 541 may be positioned on the same layer as the first sensing electrodes 520 and the second sensing electrodes 540, and the other connection part may be positioned on a different layer from the first sensing electrode 520 and the second sensing electrode 540. As a result, the plurality of first sensing electrodes 520 and the plurality of second sensing electrodes 540 may be electrically separated. The sensing electrode connection part positioned on another layer may be positioned on a layer above or below the first sensing electrode 520 and the second sensing electrode 540. In the embodiments described below, the sensing electrode connection part is a layer below the first sensing electrode 520 and the second sensing electrode 540, i.e., the sensing electrode connection part is positioned on a layer closer to the substrate.

A plurality of sensing wires 512 and 522 connected to the plurality of first sensing electrodes 520 and the plurality of second sensing electrodes 540, respectively, are positioned in the non-display area PA. The plurality of first sensing wires 512 may be connected to the plurality of second sensing electrodes 540 disposed in the first direction DR1, and the plurality of second sensing wires 522 may be connected to the plurality of first sensing electrodes 520 disposed in the second direction DR2. According to embodiments, the first sensing wire 512 and the second sensing wire 522 may be electrically connected to some of the pads PAD included in the pad unit 30 of FIG. 4.

FIG. 5 shows a sensing unit of a mutual-cap method that senses a touch using two sensing electrodes 520 and 540. However, depending on embodiments, the sensing unit may be formed as a self-cap type sensing unit that senses a touch using only one sensing electrode.

Figure 6:
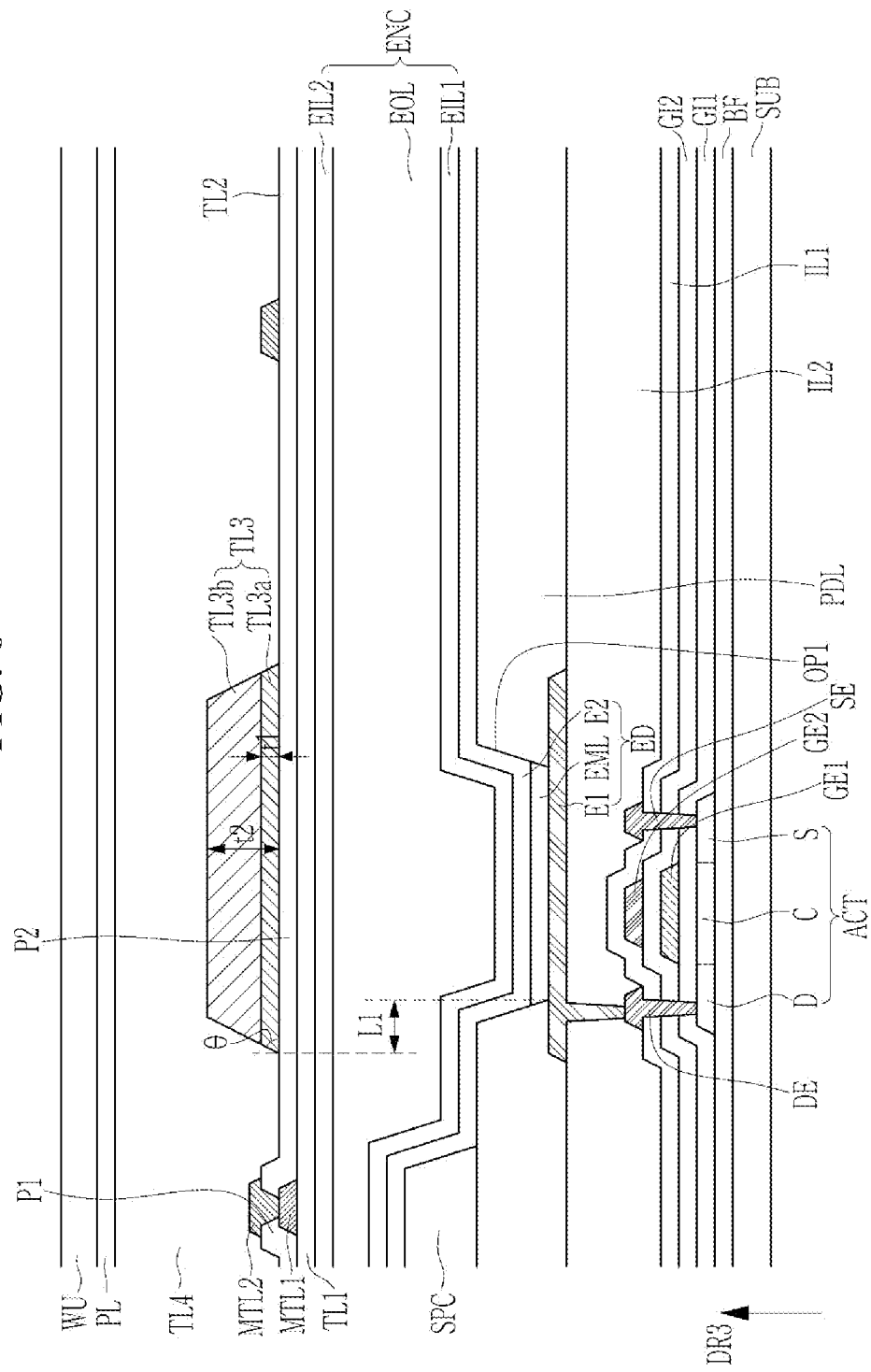
FIG. 6 is a cross-sectional view illustrating a portion of a display area in a display panel according to an embodiment.

Hereinafter, a display device according to an embodiment will be further described with reference to FIG. 6. FIG. 6 is a cross-sectional view illustrating a portion of the display area in the display device according to an embodiment.

Referring to FIG. 6, layers and regions that are parts of a pixel may be formed on a substrate SUB. The substrate SUB may include a rigid material such as glass or a flexible material such as plastic or polyimide.

A buffer layer BF may be positioned on the substrate SUB to flatten the surface of the substrate SUB and block penetration of impure elements. The buffer layer BF may include an inorganic material and may include, for example, an inorganic insulating material such as silicon nitride (SiNx), silicon oxide (SiOx), or silicon nitride oxide (SiOxNy). Depending on the embodiment, the buffer layer BF may have a single-layer or multi-layer structure including the inorganic insulating material.

In this case, a barrier layer may be positioned between the substrate SUB and the buffer layer BF. The barrier layer may include an inorganic insulating material such as silicon nitride (SiNx), silicon oxide (SiOx), or silicon nitride oxide (SiOxNy). The barrier layer (not shown) may have a single-layer or multi-layer structure including the inorganic insulating material.

A semiconductor layer ACT may be positioned on the substrate SUB. The semiconductor layer ACT may include any one of amorphous silicon, polycrystalline silicon, and an oxide semiconductor. For example, the semiconductor layer ACT may include low-temperature polysilicon (LTPS) or an oxide semiconductor including at least one of zinc (Zn), indium (In), gallium (Ga), tin (Sn), and mixtures thereof. For example, the semiconductor layer ACT may include indium-gallium-zinc oxide (IGZO).

The semiconductor layer ACT may include a channel region C, a source region S, and a drain region D, which are distinguished according to whether they are doped with impurities. The source region S and the drain region D may have conductivity characteristics corresponding to those of a conductor.

A first gate insulating layer GI1 may cover the semiconductor layer ACT and the substrate SUB. The first gate insulating layer GI1 may include an inorganic insulating material such as silicon nitride (SiNx), silicon oxide (SiOx), or silicon nitride oxide (SiOxNy). The first gate insulating layer GI1 may have a single-layer or multi-layer structure including the above inorganic insulating material.

A gate electrode GE1 may be positioned on the first gate insulating layer GI1. The gate electrode GE1 may include a metal, such as copper (Cu), molybdenum (Mo), aluminum (Al), silver (Ag), chromium (Cr), tantalum (Ta), or titanium (Ti), or a metal alloy. The gate electrode GE1 may include a single layer or multiple layers.

A region of the semiconductor layer ACT overlapping the gate electrode GE1 may be the channel region C.

A second gate insulating layer GI2 is positioned on the gate electrode GE1. The second gate insulating layer GI2 may include an inorganic insulating material such as silicon nitride (SiNx), silicon oxide (SiOx), or silicon nitride oxide (SiOxNy). The second gate insulating layer GI2 may have a single-layer or multi-layer structure including the above inorganic insulating material.

A capacitor electrode GE2 may be positioned on the second gate insulating layer GI2. The capacitor electrode GE2 may overlap the gate electrode GE1 to form a capacitor. A first insulating layer IL1 is positioned on the capacitor electrode GE2. The first insulating layer IL1 may include an inorganic insulating material such as silicon nitride (SiNx), silicon oxide (SiOx), or silicon nitride oxide (SiOxNy). The first insulating layer IL1 may have a single-layer or multi-layer structure including the above inorganic insulating material.

The source electrode SE and the drain electrode DE may be positioned on the first insulating layer IL1. The source electrode SE and the drain electrode DE are connected to the source region S and the drain region D of the semiconductor layer ACT by openings formed in the first insulating layer IL1, the second gate insulating layer GI2, and the first gate insulating layer GI1.

The aforementioned semiconductor layer ACT, gate electrode GE1, source electrode SE, and drain electrode DE form a transistor and particularly a thin film transistor (TFT). Depending on the embodiments, the transistor may include only the source and drain regions of the semiconductor layer ACT instead of the source electrode SE and the drain electrode DE.

The source electrode SE and the drain electrode DE may comprise aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or another metal or metal alloy. The source electrode SE and the drain electrode DE may be formed of a single layer or multiple layers. In an embodiment, the source electrode SE and drain electrode DE may be configured as a triple layer including an upper layer, a middle layer, and a lower layer, wherein the upper and lower layers may include titanium (Ti), and the middle layer may include aluminum (Al).

The second insulating layer IL2 may be positioned on the source electrode SE and the drain electrode DE. The second insulating layer IL2 covers the source electrode SE and the drain electrode DE. The second insulating layer IL2 may be for planarizing a surface of a structure including the substrate SUB and the transistor. The second insulating layer IL2 may be an organic insulating layer and may be selected from the group consisting of polyimide, polyamide, acrylic resin, benzocyclobutene, and phenol resin.

A first electrode E1 may be positioned on the second insulating layer IL2. The first electrode E1 may also referred to herein as an anode electrode. The first electrode E1 may be a single layer including a transparent conductive oxide layer or a metal material or may be a multiple layer structure including the same. The transparent conductive oxide layer may include indium tin oxide (ITO), poly-ITO, indium zinc oxide (IZO), indium gallium zinc oxide (IGZO), and indium tin zinc oxide (ITZO). The metal material may include silver (Ag), molybdenum (Mo), copper (Cu), gold (Au), and aluminum (Al).

The first electrode E1 may be physically and electrically connected to the drain electrode DE through the opening of the second insulating layer IL2. Accordingly, the first electrode E1 may receive an output current to be transferred from the drain electrode DE to an emission layer EML.

A pixel defining layer PDL may be positioned on the first electrode E1 and the second insulating layer IL2. The pixel defining layer PDL includes a pixel opening OP1 overlapping at least a portion of the first electrode E1. In this case, the pixel opening OP1 may overlap the center of the first electrode E1 and may not overlap the edge of the first electrode E1. Accordingly, the size of the opening OP1 may be smaller than the size of the first electrode E1. The pixel defining layer PDL may define a formation position of the emission layer EML so that the emission layer EML may be positioned on the exposed portion of the upper surface of the first electrode E1. The pixel defining layer PDL may be an organic insulating layer including one or more materials selected from the group consisting of polyimide, polyamide, acrylic resin, benzocyclobutene, and phenol resin, depending on the embodiments, and the pixel defining layer PDL may be formed of a black pixel defining layer (BPDL) including a black pigment.

The emission layer EML may be positioned within the pixel opening OP1 in the pixel defining layer PDL. The emission layer EML may include an organic material or an inorganic material capable of emitting red, green, or blue light. The emission layer EML capable of emitting red, green, and blue light may include a low-molecular material or high-molecular organic material. Although the emission layer EML is shown as a single layer in FIG. 6, auxiliary layers such as an electron injection layer, an electron transport layer, a hole transport layer, and a hole injection layer may also be included above and below the emission layer EML. For example, a hole injection layer and a hole transport layer may be positioned below the emission layer EML, and an electron transport layer and an electron injection layer may be positioned above the emission layer EML.

The second electrode E2 may be positioned on the pixel defining layer PDL and the emission layer EML. The second electrode E2 is also referred to herein as a cathode electrode and may be formed of a transparent conductive layer including indium tin oxide (ITO), indium zinc oxide (IZO), indium gallium zinc oxide (IGZO), and indium tin zinc oxide (ITZO). In an embodiment, the second electrode E2 may have a translucent property, and in this case, the second electrode E2 together with the first electrode E1 ma form a microcavity. According to the microcavity structure, light of a specific wavelength is emitted upward due to the spacing and characteristics between both electrodes, and as a result, red, green, or blue colors can be displayed.

The encapsulation layer ENC may be positioned on the second electrode E2. The encapsulation layer ENC may include at least one inorganic layer and at least one organic layer. In the illustrated embodiment, the encapsulation layer ENC may include a first inorganic encapsulation layer EIL1, an organic encapsulation layer EOL, and a second inorganic encapsulation layer EIL2. However, this is only an example, and the number of inorganic layers and organic layers constituting the encapsulation layer ENC may be variously changed.

A lower sensing insulating layer TL1 may be positioned on the encapsulation layer ENC. The lower sensing insulating layer TL1 may be formed of an inorganic insulating layer, and inorganic materials included in the inorganic insulating layer may include silicon nitride, aluminum nitride, zirconium nitride, titanium nitride, hafnium nitride, tantalum nitride, silicon oxide, aluminum oxide, and titanium oxide, tin oxide, cerium oxide, or silicon oxynitride. Depending on the embodiment, the lower sensing insulating layer TL1 may be omitted.

A lower sensing electrode MTL1 and an upper sensing electrode MTL2 may be positioned on the lower sensing insulating layer TL1. The lower sensing electrode MTL1 may include at least one of the aforementioned plurality of sensing electrodes 520 and 540, the first sensing electrode connection part 521, and the second sensing electrode connection part 541. The upper sensing electrode MTL2 may include at least one of the aforementioned plurality of sensing electrodes 520 and 540, the first sensing electrode connection part 521, and the second sensing electrode connection part 541. For example, the lower sensing electrode MTL1 may include a plurality of sensing electrodes 520 and 540 and the first sensing electrode connecting part 521, and the upper sensing electrode MTL2 may include the second sensing electrode connecting part 541. However, embodiments are not limited thereto, and the lower sensing electrode MTL1 and the upper sensing electrode MTL2 may be modified in various embodiments.

The lower sensing electrode MTL1 in the embodiment of FIG. 6 is positioned on the lower sensing insulating layer TL1. The first sensing insulating layer TL2 may be positioned on the lower sensing insulating layer TL1 and the lower sensing electrode MTL1. The first sensing insulating layer TL2 may include an inorganic insulating material or an organic insulating material. The inorganic insulating material may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic insulating material may include at least one of acrylic resin, methacrylic resin, polyisoprene, vinyl resin, epoxy resin, urethane resin, cellulose resin, and perylene resin.

The upper sensing electrode MTL2 may be positioned on the first sensing insulating layer TL2.

A second sensing insulating layer TL3 may be positioned on another part of the first sensing insulating layer TL2. For example, the second sensing insulating layer TL3 may overlap the opening OP1 in the pixel defining layer PDL to improve light emission efficiency. The second sensing insulating layer TL3 may include a light transmitting insulating material having a high refractive index. In particular, the second sensing insulating layer TL3 may have a relatively higher refractive index than a third sensing insulating layer TL4 described further below. For example, the second sensing insulating layer TL3 may have a refractive index of 1.60 to 1.90.

The second sensing insulating layer TL3 may include a first sub-sensing insulating layer TL3a and a second sub-sensing insulating layer TL3b.

The first sub-sensing insulating layer TL3a may include an inorganic insulating material, such as silicon nitride, silicon oxide, or silicon oxide nitride. The first sub-sensing insulating layer TL3a has a first refractive index, and the first refractive index may be about 1.8 to about 1.9. For example, the first refractive index may be about 1.86 at a wavelength of 550 nanometers.

A thickness t1 of the first sub-sensing insulating layer TL3a may be greater than or equal to about 1 micrometer and less than or equal to about 4 micrometers. When the thickness t1 of the first sub-sensing insulating layer TL3a is less than 1 micrometer, the effect of increasing light emission efficiency may be insufficient through the provision of a stacked structure of a high refractive index layer/medium refractive index layer/low refractive index layer. When the thickness t1 of the first sub-sensing insulating layer TL3a is greater than 4 micrometers, the total reflection amount of emitted light may increase, resulting in deterioration in light emission efficiency.

The second sub-sensing insulating layer TL3b may include an organic insulating material. The second sub-sensing insulating layer TL3b has a second refractive index, and the second refractive index may be about 1.6 to 1.7. For example, the second refractive index may be about 1.62 at a wavelength of 550 nanometers.

A thickness t2-t1 of the second sub-sensing insulating layer TL3b may be greater than or equal to about 1 micrometer and less than or equal to about 4 micrometers. When the thickness of the second sub-sensing insulating layer TL3b is less than 1 micrometer, the effect of increasing light emission efficiency may be insufficient through the provision of a stacked structure of a high refractive index layer/medium refractive index layer/low refractive index layer. If the thickness of the sensing insulating layer TL3b is greater than 4 micrometers, the total reflection amount of emitted light may increase, and thus light emission efficiency may be reduced.

A sum t2 of the thicknesses of the first sub-sensing insulating layer TL3a and the second sub-sensing insulating layer TL3b may be greater than about 2 micrometers and less than about 8 micrometers. As the thickness t2 of the second sensing insulating layer TL3 increases, the length of the side surface of the second sensing insulating layer TL3 increases, so that light emission efficiency of refracting emitted light and emitting it to the front or side may increase.

When the second sensing insulating layer is made of only the organic insulating layer, the organic insulating layer may have a refractive index of about 1.6 to about 1.67 at a wavelength of 550 nanometers. It may be difficult to provide a relatively high refractive index while having a high transmittance like the first sub-sensing insulating layer TL3a, according to an embodiment.

The second sensing insulating layer TL3 may overlap the pixel opening OP1. A boundary of the second sensing insulating layer TL3 may be a distance L1 outside or beyond a boundary of the underlying pixel opening OP1. A plane size or area of the second sensing insulating layer TL3 may be greater than the plane size or area of the pixel opening OP1. The distance L1 between the boundaries of the second sensing insulating layer TL3 and the pixel opening OP1 may be the shortest horizontal distance between the edge of the pixel opening OP1 and the edge of the second sensing insulating layer TL3.

The edge of the pixel opening OP1 may refer to the perimeter of a planar shape formed by a lower point of the edge of the pixel defining layer PDL that contacts the first electrode E1. The edge of the second sensing insulating layer TL3 may be the perimeter of a planar shape formed by a lower portion of the edge of the second sensing insulating layer TL3 that contacts the first sensing insulating layer TL2.

According to an embodiment, the distance L1 may be about 1.45 micrometers to about 9 micrometers.

Figure 7:
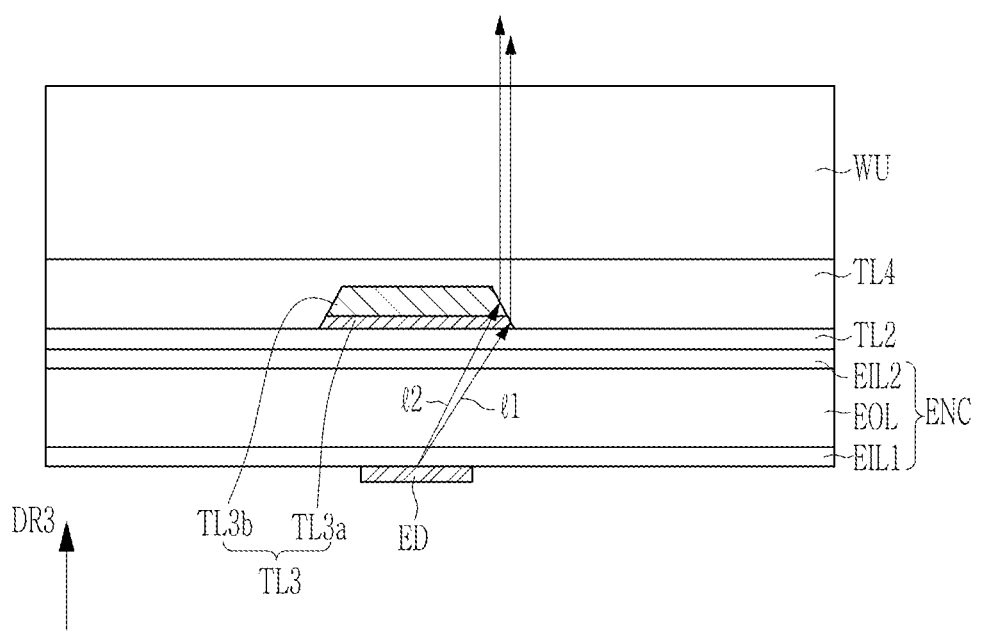
FIG. 7 and FIG. 8 are schematic cross-sectional views illustrating some components of a display panel according to an embodiment.

As the value of the distance L1 approaches 1.45 micrometers, the front light emission efficiency may increase, and as the value of the distance L1 approaches 9 micrometers, the side light emission efficiency may increase. Specifically, when the value of the distance L1 is about 1.45 micrometers to about 5 micrometers, light emitted from the light emitting device is refracted, as shown in FIG. 7, in a front direction parallel to the third direction DR3 and is emitted. Light 11 with a relatively high angle of incidence emitted from the light emitting device passes through the side of the first sub-detection insulating layer TL3a, and light 12 with a relatively low angle of incidence can pass through the side of the second sub-detection insulating layer TL3b.

Figure 8:
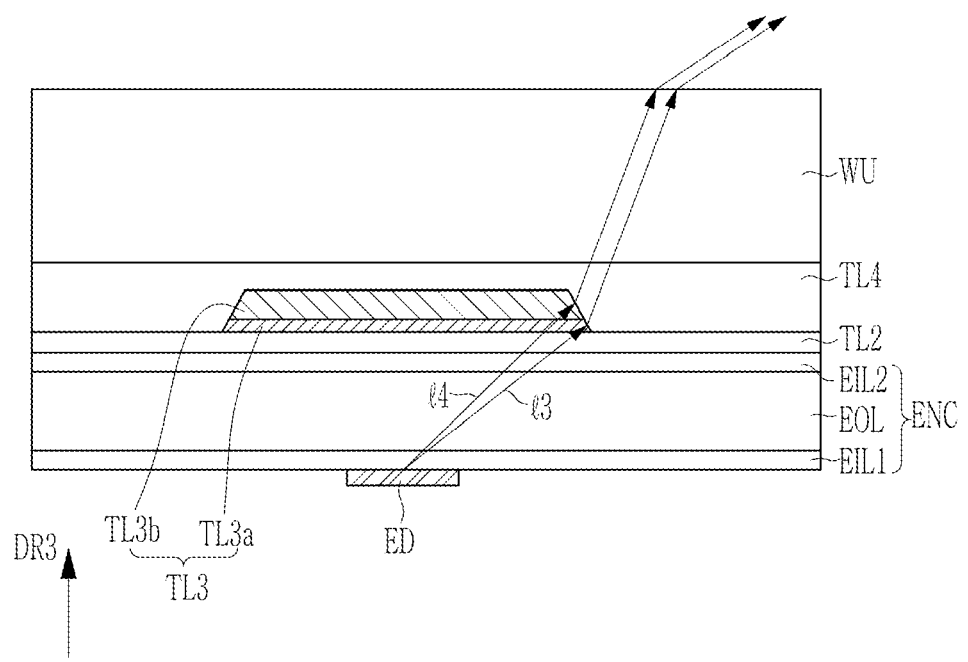

On the other hand, when the value of the distance L1 is about 5 micrometers to about 9 micrometers, as shown in FIG. 8, the light emitted from the light emitting diode and incident toward the end of the second sensing insulating layer TL3 is refracted to the side surface and emitted to the outside. Light 13 with a relatively high angle of incidence emitted from the light emitting device passes through the side of the first sub-sensing insulating layer TL3a, and light 14 with a relatively low angle of incidence can pass through the side of the second sub-detection insulating layer TL3b.

In this case, light parallel to the third direction DR3 refers to being emitted at 0 degrees, and light parallel to the first or second direction DR1 or the second direction DR2 refers to being emitted at 90 degrees. Light emitted from the light emitting device at 0 degrees to 60 degrees is emitted as it is without passing through the side surface of the second sensing insulating layer TL3. For light emitted from the light emitting device at 60 degrees to 90 degrees, the light passing through the side surface of the second sensing insulating layer TL3 may be refracted and emitted at an angle between 0 degrees and 60 degrees. According to this, the side luminance can be improved while maintaining the front luminance.

Referring back to FIG. 6, a taper angle Q of the second sensing insulating layer TL3 may be about 60 degrees to about 90 degrees. The taper angle refers to an angle formed between a side surface of the second sensing insulating layer TL3 and an upper surface of the first sensing insulating layer TL2.

A third sensing insulating layer TL4 is positioned on the upper sensing electrode MTL2 and the second sensing insulating layer TL3.

The third sensing insulating layer TL4 may include a light-transmitting organic insulating material having a low refractive index. For example, the third sensing insulating layer TL4 may include at least one of an acrylic resin, a polyimide resin, a polyamide resin, and Alq3 [Tris(8-hydroxyquinolinato) aluminium]. The third sensing insulating layer TL4 may particularly have a relatively smaller refractive index than the aforementioned second sensing insulating layer TL3. For example, the third sensing insulating layer TL4 may have a refractive index of 1.6 or less—for example, a refractive index of 1.40 to 1.59.

The third sensing insulating layer TL4 may cover the upper and side surfaces of the second sensing insulating layer TL3. The third sensing insulating layer TL4 may cover the upper and side surfaces of the first sub-sensing insulating layer TL3a and may cover the side surfaces of the second sub-sensing insulating layer TL3b.

Light emission efficiency may be improved by including the third sensing insulating layer TL4 and regions of the second sensing insulating layer TL3 on the entire surface of the emission layer EML. That is, at least a part of the light generated from each light emitting diode ED may be refracted at the interface between the overlying second sensing insulating layer TL3 and the third sensing insulating layer TL4 to emit light toward the front or side.

A polarization layer PL including a linear polarization plate and a retardation plate may be further positioned on the third sensing insulating layer TL4.

The cover window WU may be further positioned on the polarization layer PL.

Depending on the embodiment, an adhesive layer (not shown) may be further positioned between the polarization layer PL and the cover window WU. Depending on the embodiment, an adhesive layer (not shown) may be positioned between the polarization layer PL and the second sensing insulating layer TL3. When the adhesive layer satisfies the above-described characteristics of the third sensing insulating layer TL4, the adhesive layer may be used instead of the third sensing insulating layer TL4.

Figure 9:
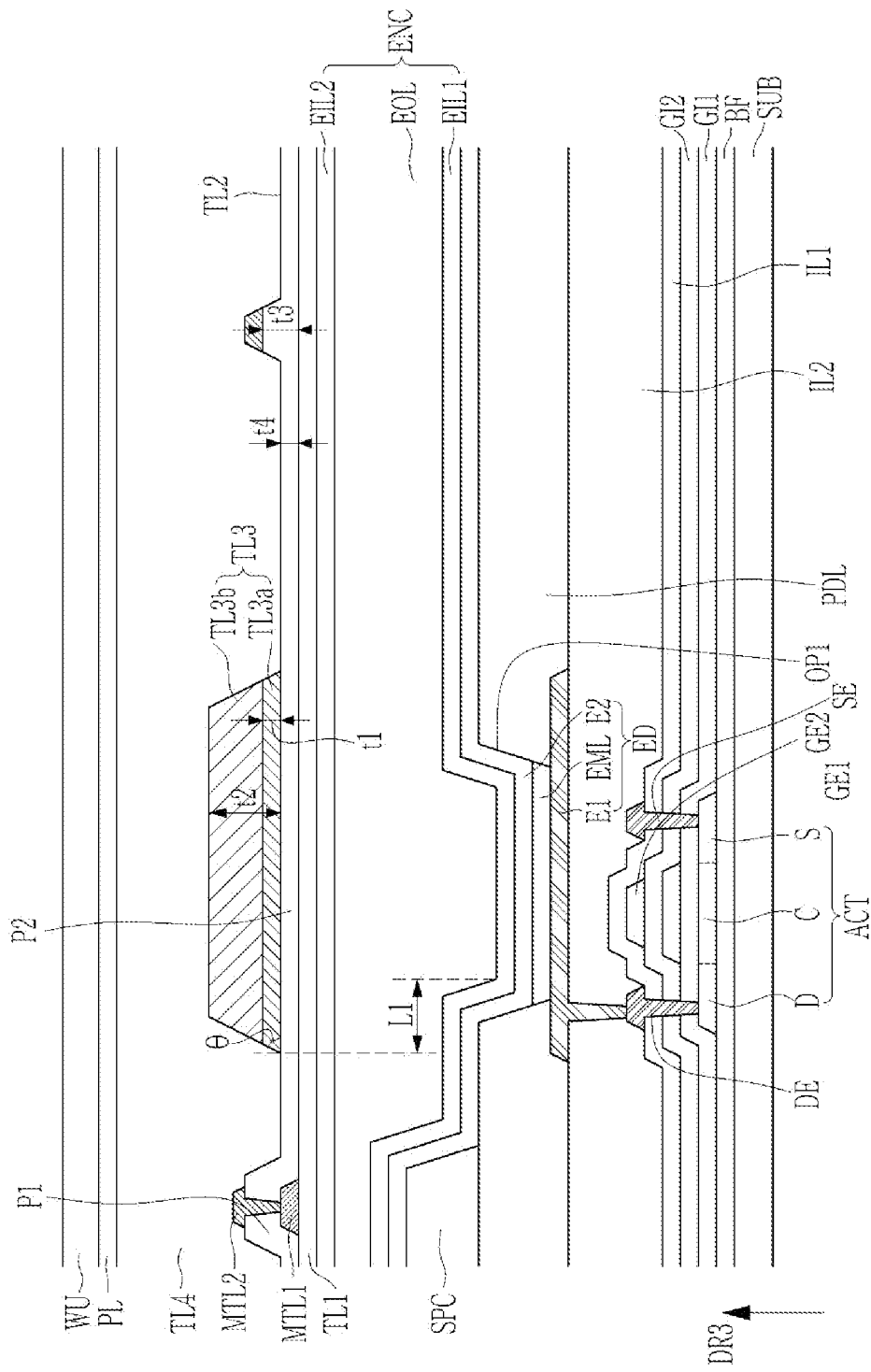
FIG. 9 is a cross-sectional view illustrating a portion of a display area in a display panel according to an embodiment.

Next, referring to FIG. 9, a display device according to an embodiment will be described. FIG. 9 is a cross-sectional view of a portion of the display panel in the display device according to the embodiment. Descriptions of constituent elements of FIG. 9 that are the same as those described in FIG. 6 will be omitted.

Referring to FIG. 9, the first sensing insulating layer TL2 according to an embodiment includes a first portion P1 having a first thickness t3 and a second portion P2 having a second thickness t4. The first thickness t3 may be greater than the second thickness t4. The first thickness t3 may be the sum of the thicknesses of the second portion P2 of the first sensing insulating layer TL2 and the first sub-sensing insulating layer TL3a.

A method of manufacturing a display device according to an embodiment will be described with reference to FIG. 10 to FIG. 13. FIG. 10, FIG. 11, FIG. 12, and FIG. 13 are cross-sectional views illustrating only some components in a process according to a manufacturing method of the display device according to an embodiment. Description of components of FIGS. 10 to 13 having the same configurations as the above-mentioned components may be found above.

Figure 10:
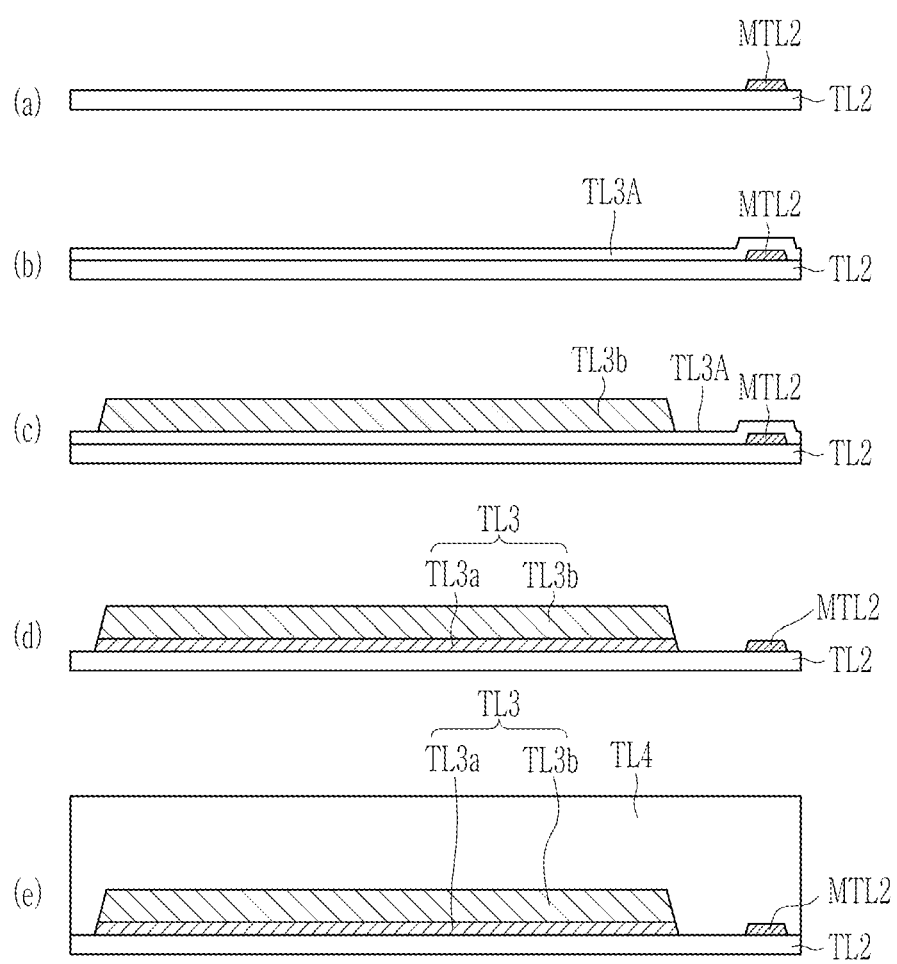
FIG. 10, FIG. 11, FIG. 12, and FIG. 13 are cross-sectional views illustrating a method of manufacturing a display panel according to an embodiment.

First, a method of manufacturing the display device according to an embodiment will be described with reference to FIG. 10.

Referring to a FIG. 10(a), the upper sensing electrode MTL2 is formed on the first sensing insulating layer TL2. The first sensing insulating layer TL2 is also shown in FIG. 6 and overlies components shown in FIG. 6 and described above.

Then, as shown in FIG. 10(b), the first sub-sensing insulating layer TL3A covering the first sensing insulating layer TL2 and the upper sensing electrode MTL2 is formed. The first sub-sensing insulating layer TL3A may be formed through a deposition process.

Then, as shown in FIG. 10(c), a second sub-sensing insulating layer TL3b is formed on the first sub-sensing insulating layer TL3A. The second sub-sensing insulating layer TL3b may be provided through a patterning process after forming an organic insulating layer.

The first sub-sensing insulating layer TL3A may be patterned using the second sub-sensing insulating layer TL3b as a mask. As shown in FIG. 10(d), the first sub-sensing insulating layer TL3a remains below the second sub-sensing insulating layer TL3b. A dry etching process may be used. The patterned first sub-sensing insulating layer TL3a forms a first sub-sensing insulating layer TL3a described above. The first sub-sensing insulating layer TL3a and the second sub-sensing insulating layer TL3b form the second sensing insulating layer TL3 described above.

Then, as shown in FIG. 10(e), a third sensing insulating layer TL4 covering the second sensing insulating layer TL3 and the upper sensing electrode MTL2 is formed.

The third sensing insulating layer TL4 may be provided through a coating process or the like. According to the process illustrated by FIG. 10, upper layers of the display device according to FIG. 6 may be manufactured.

Next, a method of manufacturing the display device according to another embodiment will be described with reference to FIG. 11.

Referring to FIG. 11(a), an upper sensing electrode MTL2 is formed on the first sensing insulating layer TL2.

Then, as shown in FIG. 11(b), a first sub-sensing insulating layer TL3A covering the first sensing insulating layer TL2 and the upper sensing electrode MTL2 is formed. The first sub-sensing insulating layer TL3A may be formed through a deposition process.

Subsequently, as shown in FIG. 11(c), the first sub-sensing insulating layer TL3A may be patterned using a separate mask. Patterning the sub-sensing insulating layer TL3A forms the first sub-sensing insulating layer TL3a.

Then, as shown in FIG. 11(d), a second sub-sensing insulating layer TL3b is formed on the first sub-sensing insulating layer TL3a. The second sub-sensing insulating layer TL3b may be provided through a patterning process after forming the organic insulating layer.

Figure 11:
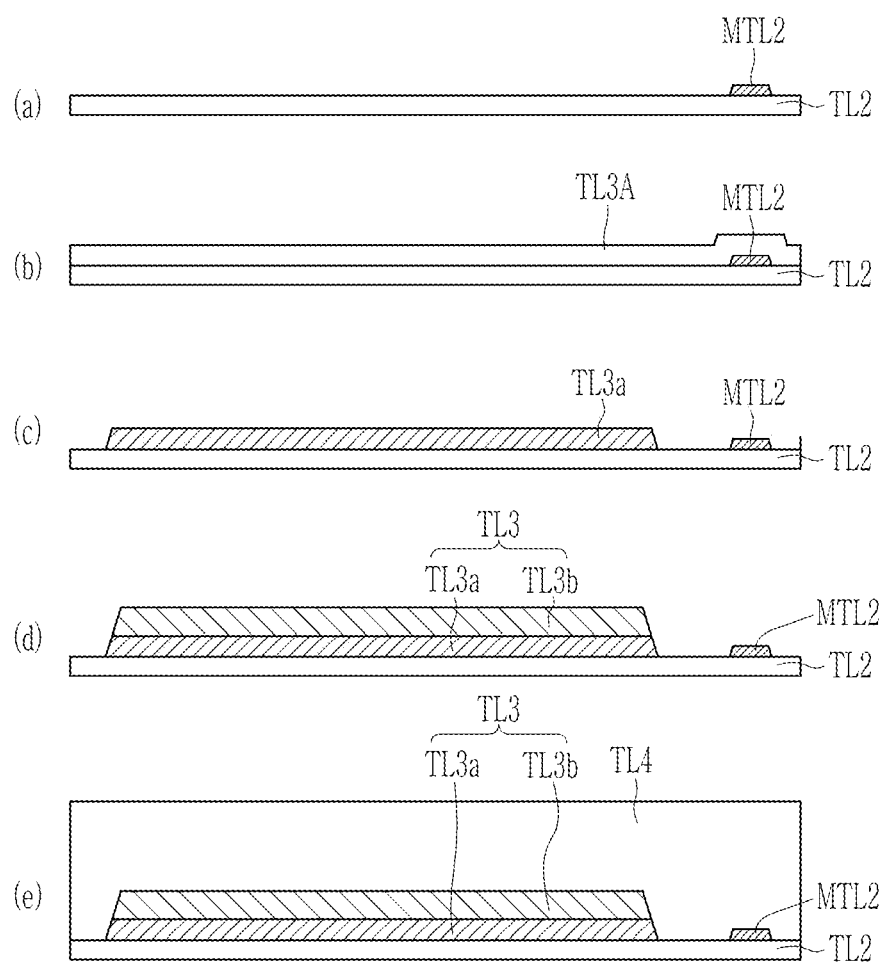

Then, as shown in FIG. 11(e), a third sensing insulating layer TL4 covering the second sensing insulating layer TL3 and the sensing electrode MTL2 is formed. The third sensing insulating layer TL4 may be provided through a coating process or the like. The process of FIG. 11 may thus produce the display device according to FIG. 6.

Figure 12:
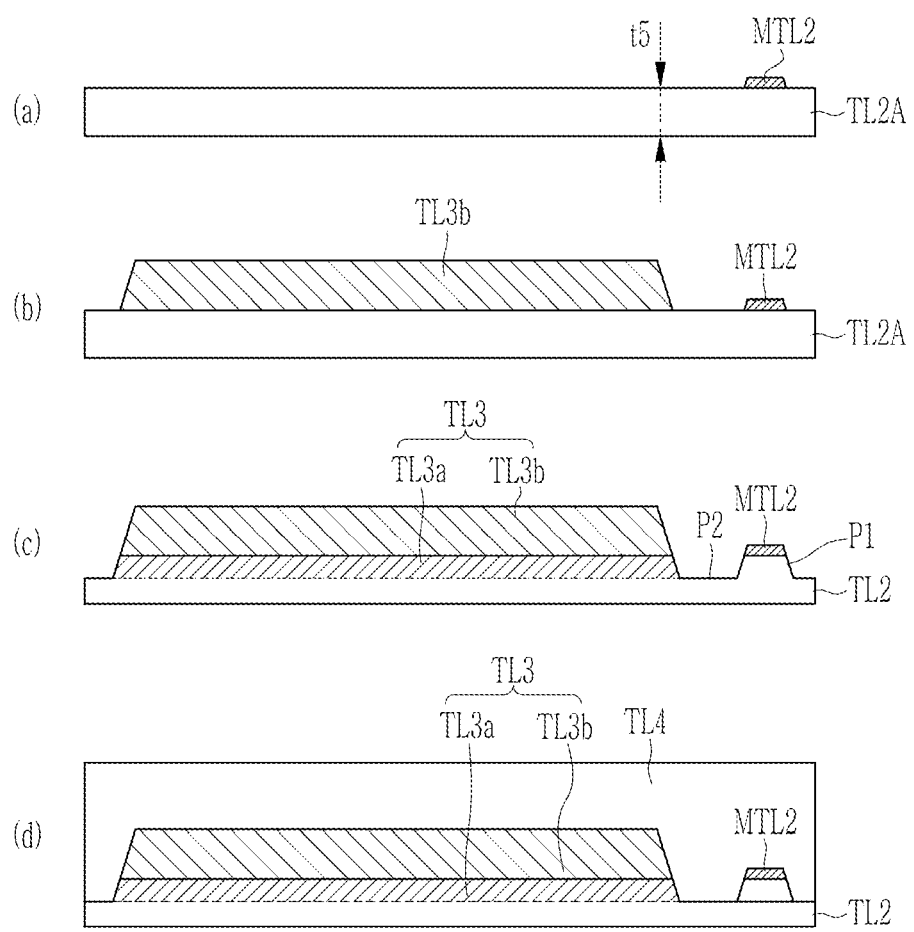

Next, a method of manufacturing the display device according to another embodiment will be described with reference to FIG. 12.

Referring to FIG. 12(a), an inorganic insulating layer TL2A having a third thickness t5 is formed. An upper sensing electrode MTL2 is formed on the inorganic insulating layer TL2A.

Then, as shown in FIG. 12(b), a second sub-sensing insulating layer TL3b is formed on the inorganic insulating layer TL2A.

Then, as shown in FIG. 12(c), the inorganic insulating layer TL2A is dry etched using the second sub-sensing insulating layer TL3b and the upper sensing electrode MTL2 as a mask. In this process, the first sensing insulating layer TL2 including the first portion P1 overlapping the upper sensing electrode MTL2 and the second portion P2 other than the upper sensing electrode MTL2 is formed. Also, a first sub-sensing insulating layer TL3a may be formed below the second sub-sensing insulating layer TL3b. The first sub-sensing insulating layer TL3a and the first sensing insulating layer TL2 may include the same material and may form one layer.

Then, as shown in FIG. 12(d), a third sensing insulating layer TL4 covering the second sensing insulating layer TL3 and the upper sensing electrode MTL2 is formed. The third sensing insulating layer TL4 may be provided through a coating process or the like. According to this embodiment, a process can produce the display device according to FIG. 9.

Figure 13:
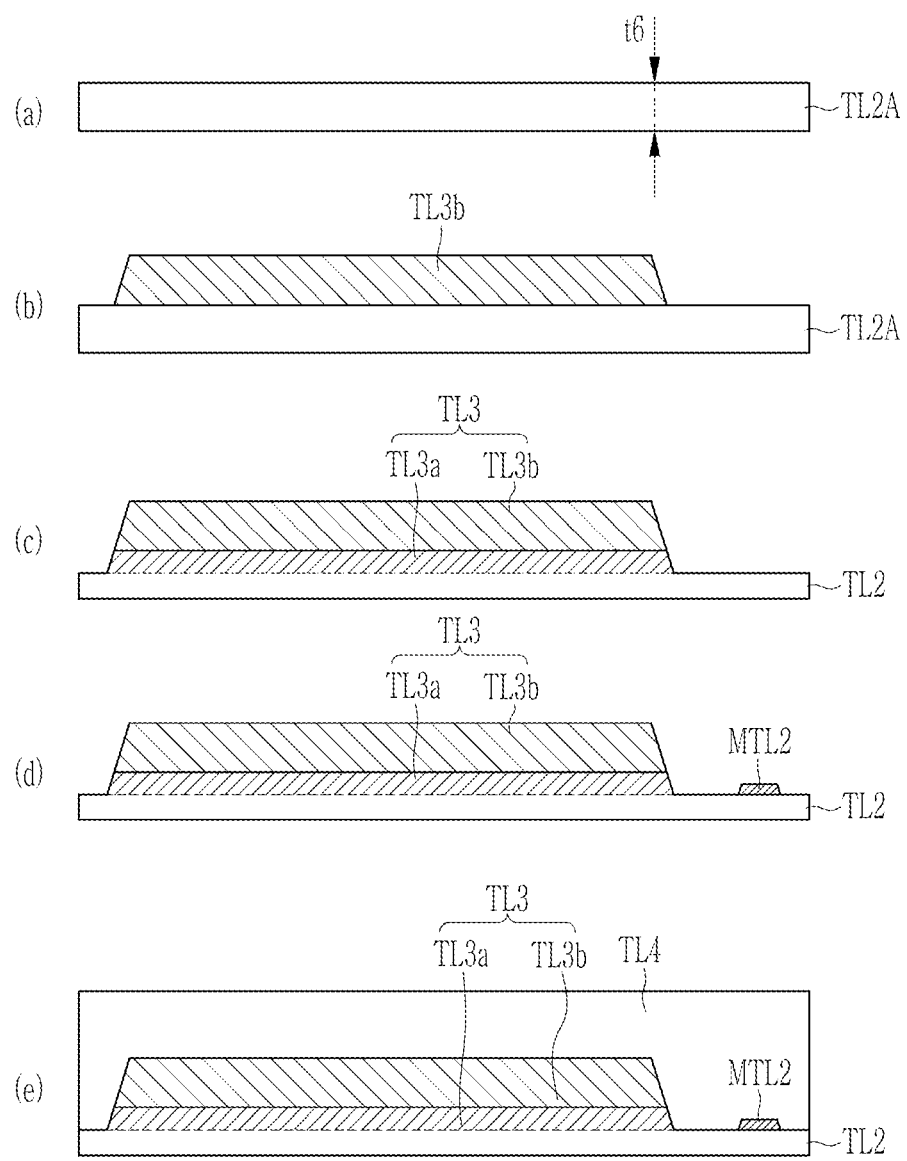

Next, a method of manufacturing the display device according to another embodiment will be described with reference to FIG. 13.

Referring to FIG. 13(a), an inorganic insulating layer TL2A having a fourth thickness t6 is formed.

Then, as shown in FIG. 13(b), a second sub-sensing insulating layer TL3b is formed on the inorganic insulating layer TL2A.

Then, as shown in FIG. 13(c), the inorganic insulating layer TL2A positioned below is dry etched using the second sub-sensing insulating layer TL3b as a mask when an etching process thins the inorganic insulating layer TL2A. According to this embodiment, the first sub-sensing insulating layer TL3a may be formed below the second sub-sensing insulating layer TL3b. In addition to this, a first sensing insulating layer TL2 may be formed. The first sub-sensing insulating layer TL3b and the first sensing insulating layer TL2 include the same material and may form one layer.

Then, as shown in FIG. 13(d), an upper sensing electrode MTL2 is formed on the first sensing insulating layer TL2.

Then, as shown in FIG. 13(e), a third sensing insulating layer TL4 covering the second sensing insulating layer TL3 and the upper sensing electrode MTL2 is formed. The third sensing insulating layer TL4 may be provided through a coating process or the like. According to this embodiment, a process can produce the display device according to FIG. 6.

Hereinafter, experimental results comparing embodiments will be described with reference to FIG. 14 to FIG. 19.

Figure 14:
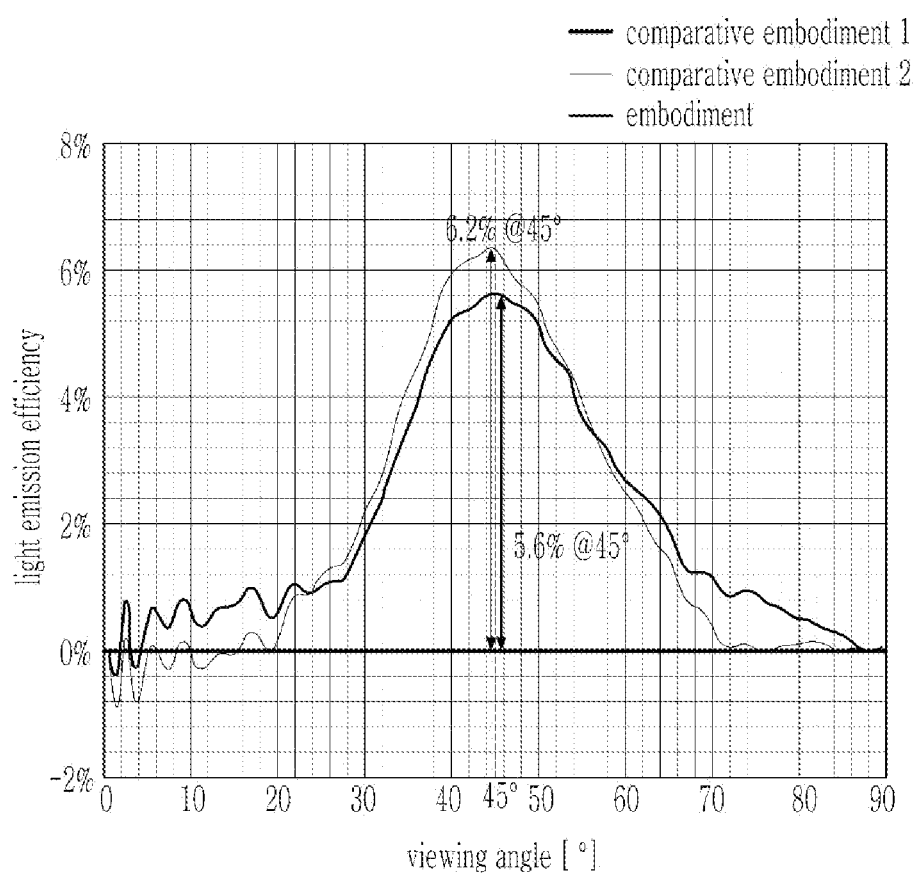
FIG. 14 is a graph showing dependence of light emission efficiency on viewing angles for embodiments and comparative embodiments.
Figure 15:
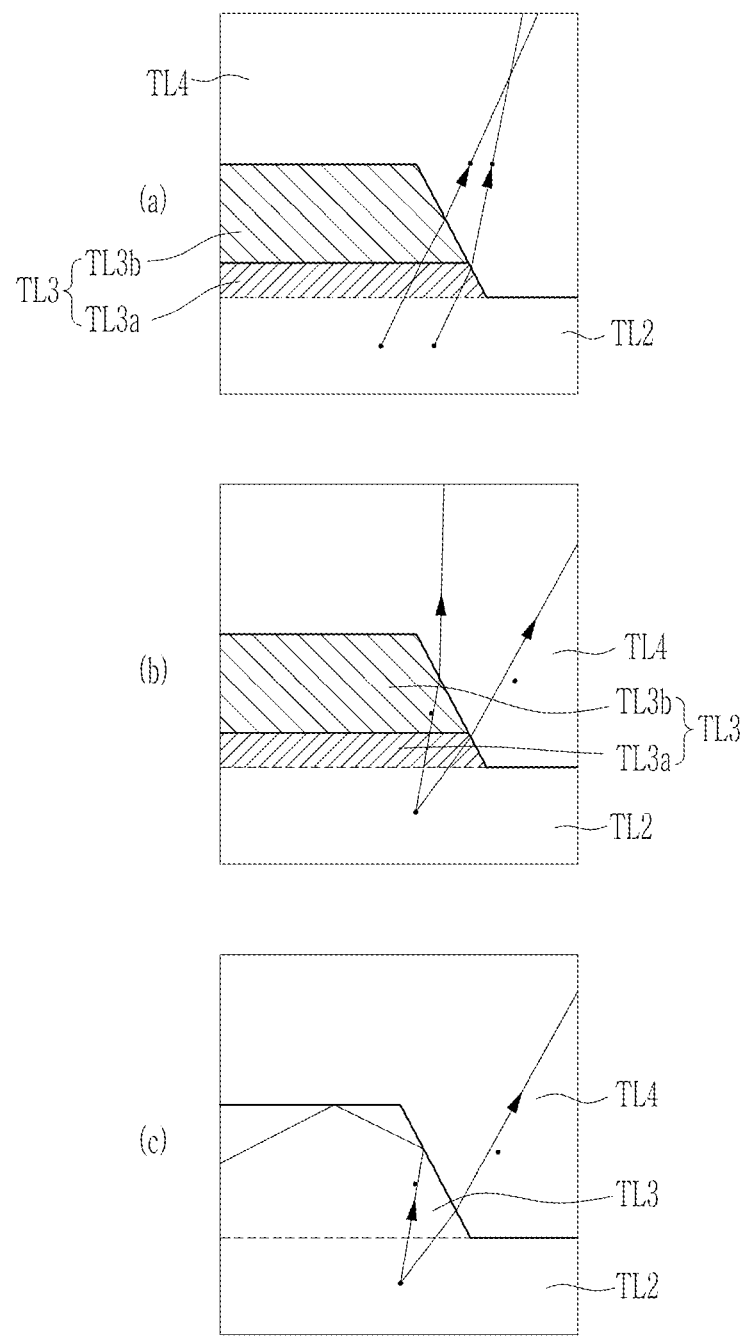
FIG. 15, FIG. 16, and FIG. 17 show light emission paths for embodiments and comparative embodiments.
Figure 16:
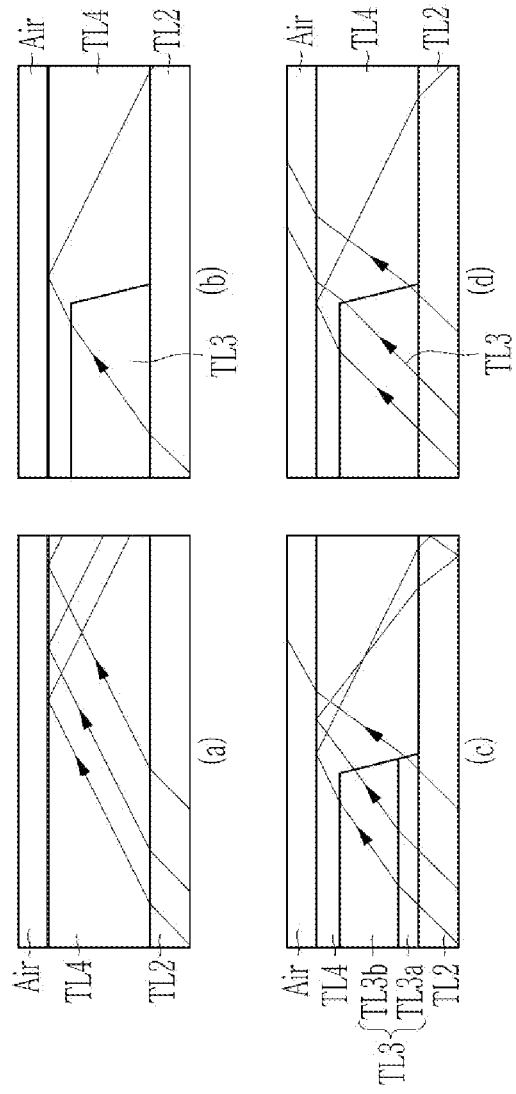
Figure 17:
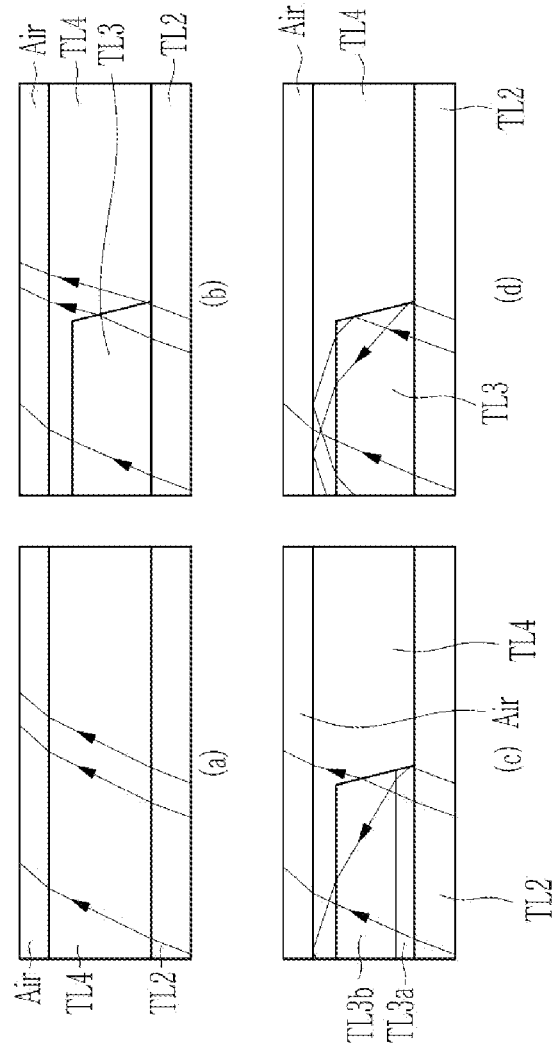
Figure 18:
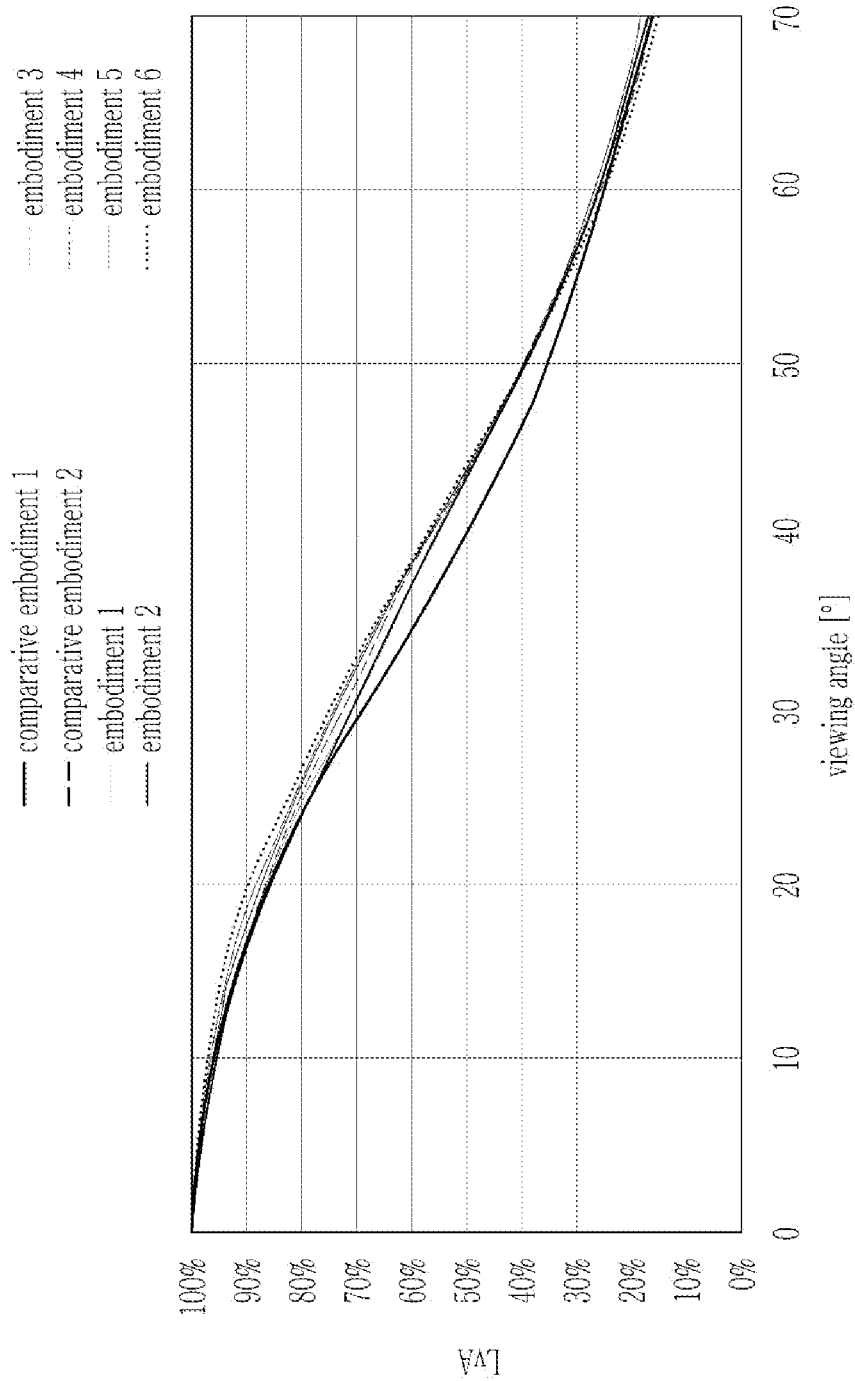
FIG. 18 is a graph showing LvA according to viewing angles for embodiments and a comparative embodiment.
Figure 19:
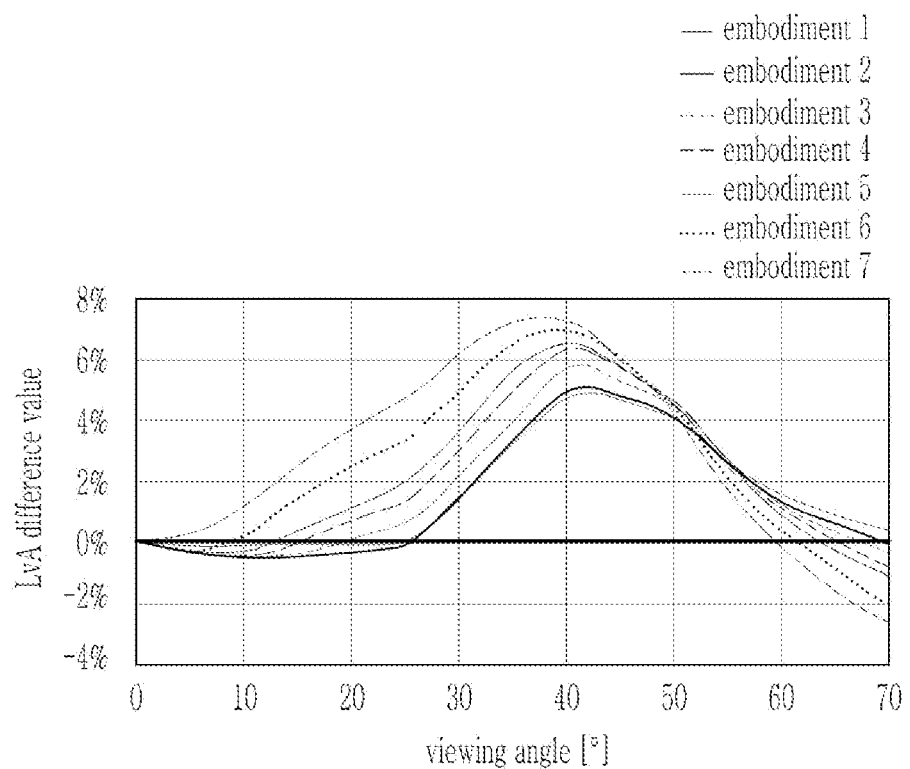
FIG. 19 is a graph showing LvA difference values according to viewing angles for embodiments and a comparative embodiment.

FIG. 14 is a graph examining light emission efficiency according to viewing angles for an embodiment and a comparative embodiment, and FIG. 15, FIG. 16, and FIG. 17 illustrate simulation results showing light emission paths for comparative embodiments and embodiments, and FIG. 18 shows embodiments and comparative embodiments in a graph showing LvA according to viewing angles for the comparative embodiments, and FIG. 19 is a graph showing LvA differences according to viewing angles for embodiments and the comparative embodiments.

First, FIG. 14 was considered a comparative embodiment 1, a comparative embodiment 2, and an embodiment. Comparative embodiment 1 of FIG. 14 includes a pixel that does not have an overlying the second sensing insulating layer. Comparative embodiment 2 includes a pixel that has a second sensing insulating layer that is 4 micrometers thick and is made of an organic material. The embodiment includes a pixel with an overlying second sensing insolation layer, and the second sensing insulation layer includes a first sub-sensing insulating layer having a thickness of 1 micrometer and containing silicon nitride and a second sub-sensing insulating layer having a thickness of 3 micrometers and made of an organic material. In both the embodiment and comparative embodiment 2, the taper angle of the second sensing insulating layer is 70°, and the distance between the end of the pixel opening and the end of the second sensing insulating layer is 8.25 micrometers.

The light emission efficiency according to the viewing angle was examined. Referring to FIG. 14 and Table 1, while maintaining the front light emission efficiency, simulation results confirmed that the side light emission efficiency was increased. See Table 1 results at 30.5° and 45.5°. In particular, simulation results show that the light emission efficiency of the embodiment at 45.5 degrees increased by 6.2% compared to comparative embodiment 1 and increased by 0.6% compared to comparative embodiment 2.

TABLE 1

|  | Comparative Embodiment 1 | Comparative Embodiment 2 | Embodiment |
|---|---|---|---|
| 0.5° | 100.0% | 100.0% | 100.0% |
| 30.5° | 67.4% | 69.4% | 69.8% |
| 45.5° | 41.1% | 46.7% | 47.3% |

FIG. 15 was considered next. FIG. 15(a) and FIG. 15(b) are ray diagrams showing paths of incident light in the same structure as in the embodiment of FIG. 14. FIG. 15(c) is a ray diagram showing a path of incident light in a comparative embodiment in which the second sensing insulating layer is made of only silicon nitride.

As shown in FIG. 15(a) and FIG. 15(b), light incident on the side of the second sensing insulating layer TL3 may be refracted according to an incident angle and emitted to the outside of the display device. In this case, depending on the distance between the end of the second sensing insulating layer TL3 and the end of the pixel opening, light incident to the side of the second sensing insulating layer may be refracted forward or refracted to the side.

On the other hand, as shown in FIG. 15(c), when the second sensing insulating layer TL3 is made of only silicon nitride, total internal reflection of light incident on the side of the second sensing insulating layer TL3 increases, and light emission efficiency may decrease.

FIG. 16 shows ray diagrams for the comparative embodiment 1, which does not include the second sensing insulating layer, and for the embodiment, which includes the second sensing insulating layer with the first sub-sensing insulating layer and the second.

FIG. 16(a) is a ray diagram showing a path along which light emitted from a light emitting device at an angle of 45 degrees moves in a structure of comparative embodiment 1 in which an inorganic insulating layer TL2/low refractive organic layer TLA/air are sequentially stacked. According to comparative embodiment 1 of FIG. 16(a), all of the light emitted at 45 degrees is totally internally reflected at the low refractive organic layer TLA/air interface, and thus the lateral light emission efficiency is reduced.

FIG. 16(b) shows a ray diagram for comparative embodiment 2 in which the second sensing insulating layer TL3 includes a high refractive organic layer. The simulation result illustrated in FIG. 16(b) shows the path of light emitted at 45 degrees from the light emitting device in a structure stacked in the order of inorganic insulating layer TL2/high refractive organic layer TL3/low refractive organic layer TLA/air. According to comparative embodiment 2 of FIG. 16(b), the light emitted at 45 degrees is also totally reflected at the interface of the low refractive index organic layer TLA/air, and the side light emission efficiency is reduced.

FIG. 16(c) shows a ray diagram for an embodiment in which the second detection insulating layer TL3 includes a first sub-sensing insulating layer TL3a made of silicon nitride material and a second sub-sensing insulating layer TL3b made of organic material. FIG. 16(c) shows a first sensing insulating layer TL2/high refractive inorganic first sub-sensing insulating layer TL3a/high second sub-sensing insulating layer TL3b/low refractive third sensing insulating layer TL4/Air stacked in this order from the light emitting device. FIG. 16(c) illustrates a simulation result by showing the paths of the light emitted at 45 degrees. According to FIG. 16(c), some of the light passing through the side surface of the first sub-sensing insulating layer TL3a was refracted and emitted to the outside.

FIG. 16(d) is a ray diagram for a comparative embodiment 3 in which the second sensing insulating layer TL3 includes only the high refractive index inorganic layer. FIG. 16(d) shows the movement of light emitted from a light emitting device at 45 degrees in a structure in which an inorganic insulating layer TL2/a high refractive index second sensing insulating layer TL3/a low refractive third sensing insulating layer TL4/Air are stacked in this order. FIG. 16(d) illustrates the simulation result by showing the light paths. According to comparative embodiment 3 of FIG. 16(d), among the light emitted at 45 degrees, the light passing through the side surface of the high refractive second sensing insulating layer TL3 may be refracted and emitted, but the light passing through the upper surface of the high refractive second sensing insulating layer TL3 is totally internally reflected at the interface of the low refractive third sensing insulating layer TLA/Air. Light emission efficiency may thus be reduced.

Looking at the simulation results illustrated in FIG. 16, it was confirmed that when the second sensing insulating layer includes silicon nitride, light incident on a side surface of the corresponding layer may be refracted and emitted to the outside of the display panel. Through this, it is possible to increase side emission efficiency. However, as shown in FIG. 15(c), when the second sensing insulating layer is made of only silicon nitride, the total internal reflection efficiency increases according to the angle of the incident light.

FIG. 17 shows ray diagrams for light from a light emitting device is incident at 20°.

FIG. 17(a) is for comparative embodiment 1, which does not include the second sensing insulating layer. FIG. 17(a) is a ray diagram showing paths along which light emitted from the light emitting device at an angle of 20 degrees moves in a structure in which a first sensing insulating layer TL2/low refractive third sensing insulating layer TL4/air are sequentially stacked. According to comparative embodiment 1 of FIG. 17(a), all light emitted at 20 degrees was emitted while being refracted to air in the low refractive third sensing insulating layer TLA.

FIG. 17(b) is for comparative embodiment 2 in which the second sensing insulating layer TL3 includes a high refractive organic layer. FIG. 17(b) shows a path along which light emitted from the light emitting device at 20 degrees travels in a structure in which a first sensing insulating layer TL2, a high refractive second sensing insulating layer TL3, a low refractive third sensing insulating layer TL4, and air are stacked in this order. For comparative embodiment 2 of FIG. 17(b), all light emitted at 20 degrees was also refracted in the front direction, and all light was emitted.

FIG. 17(c) is for an embodiment in which the second sensing insulating layer TL3 includes a first sub-sensing insulating layer TL3a made of silicon nitride material and a second sub-sensing insulating layer TL3b made of organic material. FIG. 17(c) shows a first sensing insulating layer TL2/high refractive first sub-sensing insulating layer TL3a/ high refractive second sub-sensing insulating layer TL3b/low refractive third sensing insulating layer TL4/air stacked in this order from the light emitting device. FIG. 17(c) shows paths along which the light emitted at 20 degrees travels. In FIG. 17(c), the light incident on the side of the first sub-sensing insulating layer TL3a is totally internally reflected and refracted at the interface between the first sub-sensing insulating layer TL3a and the third sensing insulating layer TL4. After the total internal reflection at the side of the first sub-sensing insulating layer TL3a, the light may also be totally reflected at the interface of the third sensing insulating layer TL4 with air. It was confirmed that no light was emitted.

FIG. 17(d) is a ray diagram for comparative embodiment 3 in which the second sensing insulating layer TL3 includes only the high refractive index inorganic layer. FIG. 17(d) shows the simulation result indicating a path along which light emitted from the light emitting diode at 20 degrees moves in a structure in which a first sensing insulating layer TL2, a high refractive index second sensing insulating layer TL3, a low refractive third sensing insulating layer TL4, and air are stacked in this order. For comparative embodiment 3 of FIG. 17(d), among the light emitted at 20 degrees, the light towards to the side of the high refractive second sensing insulating layer TL3 is totally reflected at the interface between the high refractive second sensing insulating layer TL3 and the low refractive third sensing insulating layer TL4 and light emission efficiency is reduced.

Looking at the simulation results of FIG. 17, light incident with a small incident angle compared to the incident angle illustrated in FIG. 16 may be refracted and emitted through the interfaces between the high refractive second sub-sensing insulating layer TL3b and the low refractive third sensing insulating layer TL4 and the high refractive first sub-sensing insulating layer TL3a. No light was emitted from the interface of the low refractive third sensing insulating layer TL4.

According to the simulation results of FIG. 16 and FIG. 17, both the first sub-sensing insulating layer, which is a high-refractive inorganic layer, and the second sub-sensing insulating layer, which is a high refractive organic layer, are required to efficiently emit incident light having various incident angles.

For reference, in the comparative embodiments and embodiments of FIG. 16 and FIG. 17, the inorganic first sensing insulating layer TL2 has a refractive index of 1.89, and the high refractive index first sub-sensing insulating layer TL3a has a refractive index of 1.86 and includes silicon nitride. The high refractive index second sub-sensing insulating layer TL3b has a refractive index of 1.65, the low refractive index third sensing insulating layer TL4 has a refractive index of 1.5, and air has a refractive index of 1. In this case, the inorganic first sensing insulating layer TL2 may be a first sensing insulating layer or a second encapsulating inorganic layer, and the low refractive index organic layer TL4 may be a third sensing insulating layer or an adhesive layer PSA.

FIG. 18 is a graph examining LvA according to viewing angles for comparative embodiments Comparative embodiment and embodiments. LvA is the ratio of the side light emission efficiency to the front light emission efficiency. For FIG. 18, comparative embodiment 1 does not include the second sensing insulating layer, and comparative embodiment 2 includes a high refractive index organic layer having a thickness of 4 micrometers.

Embodiment 1 to embodiment 6 include a first sub-sensing insulating layer made of silicon nitride and a second sub-sensing insulating layer made of an organic material. In embodiment 1, the thickness of the first sub-sensing insulating layer is 0.5 micrometers, and the thickness of the second sub-sensing insulating layer is 3.5 micrometers. In embodiment 2, the thickness of the first sub-sensing insulating layer is 1.0 micrometers, and the thickness of the second sub-sensing insulating layer is 3.0 micrometers. In embodiment 3, the thickness of the first sub-sensing insulating layer is 1.5 micrometers, and the thickness of the second sub-sensing insulating layer is 2.5 micrometers. In embodiment 4, the thickness of the first sub-sensing insulating layer is 2.0 micrometers, and the thickness of the second sub-sensing insulating layer is 2.0 micrometers. In embodiment 5, the thickness of the first sub-sensing insulating layer is 2.5 micrometers, and the thickness of the second sub-sensing insulating layer is 1.5 micrometers. In embodiment 6, the thickness of the first sub-sensing insulating layer is 3.0 micrometers, and the thickness of the second sub-sensing insulating layer is 1.0 micrometers.

The second sensing insulating layer for comparative embodiment 2 and embodiment 1 to embodiment 6 have a taper angle of 70 degrees, and the distance L1 that the second sensing insulating layer extends beyond a boundary of the underlying pixel opening is 8 micrometers.

Values plotted in FIG. 18 are shown in Table 2 below.

FIG. 19 is a graph showing LvA difference values of comparative embodiment 1, comparative embodiment 2, and embodiment 1 to embodiment 6, having the characteristics described above with reference to FIG. 18 and Table 2. Values plotted in FIG. 19 are shown in Table 3 below.

TABLE 2

| viewing angle [°] | 0.5 | 5.5 | 10.5 | 15.5 | 20.5 | 25.5 | 30.5 | 35.5 |
|---|---|---|---|---|---|---|---|---|
| comparative embodiment 1 | 100.0% | 98.5% | 96.4% | 91.3% | 84.7% | 78.9% | 68.0% | 58.5% |
| comparative embodiment 2 | 100.0% | 98.3% | 96.2% | 91.2% | 84.6% | 77.0% | 69.6% | 61.9% |
| embodiment 1 | 100.0% | 98.1% | 94.9% | 90.8% | 84.4% | 76.9% | 69.6% | 62.0% |
| embodiment 2 | 100.0% | 98.1% | 94.9% | 90.9% | 84.9% | 77.5% | 70.3% | 62.7% |
| embodiment 3 | 100.0% | 98.1% | 94.9% | 91.3% | 85.5% | 78.3% | 71.2% | 63.5% |
| embodiment 4 | 100.0% | 98.1% | 96.0% | 91.7% | 85.9% | 78.9% | 71.9% | 64.2% |
| embodiment 5 | 100.0% | 98.1% | 96.7% | 92.9% | 87.3% | 80.3% | 73.1% | 65.1% |
| embodiment 6 | 100.0% | 98.7% | 96.6% | 93.9% | 88.5% | 81.7% | 74.3% | 65.7% |

TABLE 2-continued

| viewing angle [°] | 40.5 | 45.5 | 50.5 | 55.5 | 60.5 | 65.5 | 70.5 |
|---|---|---|---|---|---|---|---|
| comparative embodiment 1 | 49.3% | 41.5% | 34.5% | 29.3% | 24.6% | 21.1% | 17.9% |
| comparative embodiment 2 | 54.0% | 46.1% | 33.4% | 31.8% | 26.1% | 21.9% | 18.3% |
| embodiment 1 | 54.2% | 46.2% | 33.4% | 31.7% | 25.8% | 21.5% | 17.9% |
| embodiment 2 | 55.0% | 46.7% | 38.7% | 31.9% | 25.7% | 21.3% | 17.5% |
| embodiment 3 | 55.8% | 47.0% | 38.9% | 31.8% | 25.5% | 21.0% | 17.0% |
| embodiment 4 | 55.8% | 47.1% | 38.8% | 31.8% | 25.3% | 20.7% | 16.7% |
| embodiment 5 | 56.2% | 47.3% | 38.7% | 31.2% | 24.8% | 20.0% | 15.9% |
| embodiment 6 | 56.4% | 47.3% | 38.4% | 30.8% | 24.2% | 19.4% | 15.2% |

TABLE 3

| viewing angle [°] | 0.5 | 5.5 | 10.5 | 15.5 | 20.5 | 25.5 | 30.5 | 35.5 | 40.5 | 45.5 | 50.5 | 55.5 | 60.5 | 65.5 | 70.5 |
|---|---|---|---|---|---|---|---|---|---|---|---|---|---|---|---|
| comparative embodiment 2 | 0.0% | −0.2% | −0.1% | −0.1% | −0.1% | 0.1% | 1.6% | 3.4% | 4.8% | 4.6% | 3.9% | 2.5% | 1.5% | 0.8% | 0.3% |
| embodiment 1 | 0.0% | −0.3% | −0.4% | −0.5% | −0.3% | 0.0% | 1.6% | 3.5% | 4.9% | 4.7% | 4.0% | 2.4% | 1.3% | 0.5% | −0.1% |
| embodiment 2 | 0.0% | −0.3% | −0.4% | −0.4% | 0.2% | 0.7% | 2.3% | 4.2% | 5.7% | 5.2% | 4.3% | 2.5% | 1.2% | 0.2% | −0.4% |
| embodiment 3 | 0.0% | −0.3% | −0.5% | 0.0% | 0.8% | 1.4% | 3.1% | 5.0% | 6.3% | 5.6% | 4.4% | 2.5% | 1.0% | −0.1% | −0.9% |
| embodiment 4 | 0.0% | −0.3% | −0.3% | 0.4% | 1.2% | 2.1% | 3.8% | 5.7% | 6.5% | 5.6% | 4.3% | 2.3% | 0.7% | −0.4% | −1.3% |
| embodiment 5 | 0.0% | −0.3% | 0.3% | 1.6% | 2.6% | 3.5% | 5.1% | 6.6% | 7.0% | 5.9% | 4.2% | 1.9% | 0.2% | −1.1% | −2.1% |
| embodiment 6 | 0.0% | 0.3% | 1.2% | 2.6% | 3.8% | 4.8% | 6.3% | 7.2% | 7.2% | 5.9% | 4.0% | 1.5% | −0.3% | −1.7% | −2.8% |

In Table 2 and Table 3, in the case of embodiment 2 to embodiment 6, compared to comparative embodiment 1 and comparative embodiment 2, the LvA value increased at a viewing angle within 60 degrees. That is, it was confirmed that the side emission efficiency increased.

In the display device according to an embodiment, the second sensing insulating layer may include a first sub-sensing insulating layer and a second sub-sensing insulating layer. The first sub-sensing insulating layer may have a higher refractive index than the second sub-sensing insulating layer. The refractive index may decrease in the order of the first sub-sensing insulating layer/second sub-sensing insulating layer/third sensing insulating layer. With this structure, among light emitted from the light emitting device, light incident at an angle of 60 degrees or more may be refracted to compensate for luminance around a viewing angle of 45 degrees. That is, it is possible to provide a display device with increased lateral emission efficiency.

Although the embodiments of the present invention have been described in detail above, the scope of the present invention is not limited thereto, and various modifications and improvements made by those skilled in the art using the basic concept of the present invention defined in the following claims are also included in the scope of the present invention.

DESCRIPTION OF SYMBOLS

SUB: substrate
E1: first electrode
OP1: pixel opening
PDL: pixel definition layer
ENC: encapsulation layer
MTL1, MTL2: sensing electrode
TL1: lower sensing insulating layer
TL2: first sensing insulating layer
TL3: second sensing insulating layer
TL3a: first sub-sensing insulating layer
TL3b: second sub-sensing insulating layer
TL4: third sensing insulating layer

What is claimed is:

1. A display device, comprising:
a substrate;
a transistor positioned on the substrate;
a first electrode electrically connected to the transistor;
a light emission layer disposed on the first electrode;
a pixel defining layer positioned on the first electrode and including a pixel opening overlapping the first electrode;
an encapsulation layer positioned on the pixel defining layer and the first electrode;
a sensing electrode positioned on the encapsulation layer;
a second sensing insulating layer positioned on the sensing electrode and overlapping the pixel opening; and
a third sensing insulating layer disposed on the second sensing insulating layer and the sensing electrode,
wherein the second sensing insulating layer comprises:
a first sub-sensing insulating layer having a first refractive index and including an inorganic material; and
a second sub-sensing insulating layer having a second refractive index and including an organic material,
wherein the first refractive index is greater than the second refractive index, and
wherein the first sub-sensing insulating layer and the second sub-sensing insulating layer have an island pattern overlapping a center portion of the light emission layer and separated from the sensing electrode.

2. The display device of claim 1, wherein the first refractive index is in a range from about 1.8 to about 1.9.

3. The display device of claim 1, wherein the second refractive index is about 1.6 to about 1.7.

4. The display device of claim 1, wherein a thickness of the first sub-sensing insulating layer is greater than or equal to about 1 micrometer and less than about 4 micrometers.

5. The display device of claim 1, wherein
a thickness of the second sensing insulating layer is greater than or equal to about 2 micrometers and less than about 8 micrometers.

6. The display device of claim 1, wherein
the second sensing insulating layer has a taper angle in a range from 60 degrees to 90 degrees.

7. A display device, comprising:
a substrate;
a transistor positioned on the substrate;
a first electrode electrically connected to the transistor;
a pixel defining layer positioned on the first electrode and including a pixel opening overlapping the first electrode;
an encapsulation layer positioned on the pixel defining layer and the first electrode;
a sensing electrode positioned on the encapsulation layer;
a second sensing insulating layer positioned on the sensing electrode and overlapping the pixel opening; and
a third sensing insulating layer disposed on the second sensing insulating layer and the sensing electrode,
wherein the second sensing insulating layer comprises:
a first sub-sensing insulating layer having a first refractive index and including an inorganic material; and
a second sub-sensing insulating layer having a second refractive index and including an organic material,
wherein the first refractive index is greater than the second refractive index, and
wherein a lateral distance between an edge of the pixel opening and an edge of the second sensing insulating layer is in a range from about 1.45 micrometers to about 9 micrometers.

8. The display device of claim 1, wherein
a refractive index of the third sensing insulating layer is about 1.6 or less.

9. The display device of claim 1, further comprising:
a first sensing insulating layer positioned between the encapsulation layer and the second sensing insulating layer.

10. The display device of claim 9, wherein
the first sensing insulating layer comprises:
a first portion having a first thickness; and
a second portion having a second thickness,
wherein the first thickness is greater than the second thickness.

11. The display device of claim 10, wherein
the first portion overlaps the sensing electrode.

12. The display device of claim 10, wherein
the first thickness of the first portion is equal to a sum of the second thickness of the second portion and a thickness of the first sub-sensing insulating layer.

13. The display device of claim 9, wherein
the first sub-sensing insulating layer and the first sensing insulating layer include the same material.

14. A display device, comprising:
a substrate;
a transistor positioned on the substrate;
a first electrode electrically connected to the transistor;
a light emission layer disposed on the first electrode;
a pixel defining layer disposed on the first electrode and including a pixel opening overlapping the first electrode;
an encapsulation layer positioned on the pixel defining layer and the first electrode;
a sensing electrode positioned on the encapsulation layer;
a first sub-sensing insulating layer positioned on the sensing electrode and overlapping the pixel opening;
a second sub-sensing insulating layer positioned on the first sub-sensing insulating layer and
a third sensing insulating layer covering side surfaces of the first sub-sensing insulating layer and side surfaces and an upper surface of the second sub-sensing insulating layer,
wherein a refractive index decreases in order of the first sub-sensing insulating layer, the second sub-sensing insulating layer, and the third sensing insulating layer, and
wherein the first sub-sensing insulating layer and the second sub-sensing insulating layer have an island pattern overlapping a center portion of the light emission layer and separated from the sensing electrode.

15. The display device of claim 14, wherein
the first sub-sensing insulating layer and the second sub-sensing insulating layer overlap the pixel opening and a portion of the pixel defining layer.

16. The display device of claim 14, wherein
the first sub-sensing insulating layer includes an inorganic material, and
the second sub-sensing insulating layer and the third sensing insulating layer include an organic material.

17. The display device of claim 14, wherein
the refractive index of the first sub-sensing insulating layer is in a range from about 1.8 to about 1.9,
the refractive index of the second sub-sensing insulating layer is in a range from about 1.6 to about 1.7, and
the refractive index of the second sensing insulating layer is less than about 1.6.

18. The display device of claim 14, wherein
a thickness of each of the first sub-sensing insulating layer and the second sub-sensing insulating layer is in a range from about 1 micrometer to about 4 micrometers.

19. The display device of claim 14, further comprising a first sensing insulating layer positioned under the first sub-sensing insulating layer.

20. The display device of claim 19, wherein
the first sensing insulating layer and the first sub-sensing insulating layer include the same material.

* * * * *